(12) United States Patent
Murata et al.

(10) Patent No.: US 6,734,671 B2
(45) Date of Patent: May 11, 2004

(54) MAGNETIC SENSOR AND MANUFACTURING METHOD THEREFOR

(75) Inventors: Yuichiro Murata, Nagoya (JP); Inao Toyoda, Anjo (JP); Yasutoshi Suzuki, Okazaki (JP); Hirofumi Uenoyama, Nishikasugai-gun (JP); Toshihisa Suzuki, Hamamatsu (JP); Osamu Mochizuki, Hamakita (JP); Kiyoshi Natsume, Inasa-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/091,592

(22) Filed: Mar. 7, 2002

(65) Prior Publication Data

US 2002/0186011 A1 Dec. 12, 2002

(30) Foreign Application Priority Data

Mar. 7, 2001 (JP) ......................................... 2001-063524
Feb. 8, 2002 (JP) ......................................... 2002-032565

(51) Int. Cl.$^7$ ........................... G01R 33/09; H01L 29/82
(52) U.S. Cl. ....................... 324/252; 257/421; 338/32 R
(58) Field of Search ........................ 338/32 R; 257/421; 324/249, 252, 207.21; 438/48, 51, 55, 99; 360/319, 320, 324.2; 428/692, 694 SL

(56) References Cited

U.S. PATENT DOCUMENTS

| | | | | |
|---|---|---|---|---|
| 4,943,882 A | * | 7/1990 | Wada et al. ................. 360/126 |
| 5,201,451 A | * | 4/1993 | Desai et al. .................. 228/5.5 |
| 5,442,223 A | * | 8/1995 | Fujii ........................... 257/506 |
| 5,471,084 A | * | 11/1995 | Suzuki et al. ................ 257/421 |
| 5,543,989 A | | 8/1996 | Westwood |
| 5,561,368 A | | 10/1996 | Dovek et al. |
| 5,618,738 A | * | 4/1997 | Ao et al. ........................ 438/3 |
| 5,686,193 A | | 11/1997 | Westwood |
| 5,686,837 A | | 11/1997 | Coehoorn et al. |
| 6,177,731 B1 | * | 1/2001 | Ishida et al. ................. 257/780 |
| 6,191,577 B1 | * | 2/2001 | Sasaki et al. ........... 324/207.21 |
| 6,313,627 B1 | * | 11/2001 | Van Den Berg ............ 324/252 |
| 6,315,875 B1 | * | 11/2001 | Sasaki .................... 204/192.34 |
| 6,329,087 B1 | * | 12/2001 | Okamoto .................... 428/692 |
| 6,424,508 B1 | * | 7/2002 | Tadokoro et al. ......... 360/324.2 |
| 6,504,690 B2 | * | 1/2003 | Komuro et al. .......... 360/324.2 |
| 2002/0145835 A1 | * | 10/2002 | Suzuki et al. ............ 360/324.2 |

FOREIGN PATENT DOCUMENTS

| | | | |
|---|---|---|---|
| JP | A-54-127363 | 10/1979 | |
| JP | A-57-173988 | 10/1982 | |
| JP | A-59-36319 | 2/1984 | |
| JP | A-59-60726 | 4/1984 | |
| JP | A-60-211988 | 10/1985 | |
| JP | A-1-96815 | 4/1989 | |
| JP | A-5-2033 | 1/1993 | |
| JP | A-5-62381 | 3/1993 | |
| JP | A-7-92199 | 4/1995 | |
| JP | 10209521 A * | 8/1998 | ........... H01L/43/08 |
| JP | A-11-505966 | 5/1999 | |
| JP | A-2000-504415 | 4/2000 | |

* cited by examiner

Primary Examiner—N. Le
Assistant Examiner—Darrell Kinder
(74) Attorney, Agent, or Firm—Posz & Bethards, PLC

(57) ABSTRACT

Magnetoresistive devices are formed on the insulating surface of a substrate made of silicon. The devices are connected in series through an insulating film using a wiring layer formed on the surface of the substrate. An insulating film for passivation is formed to cover the devices and the wiring layer. A magnetic shield layer of Ni—Fe alloy is formed on the passivation insulating film through an organic film for relieving thermal stress to cover one of the devices. After removal of the sensor chip containing the magnetoresistive devices and other components from the wafer, the chip is bonded to a lead frame through an Ag paste layer by heat treatment. Preferably, the magnetic shield layer is made of a Ni—Fe alloy having a Ni content of 69% or less.

14 Claims, 22 Drawing Sheets

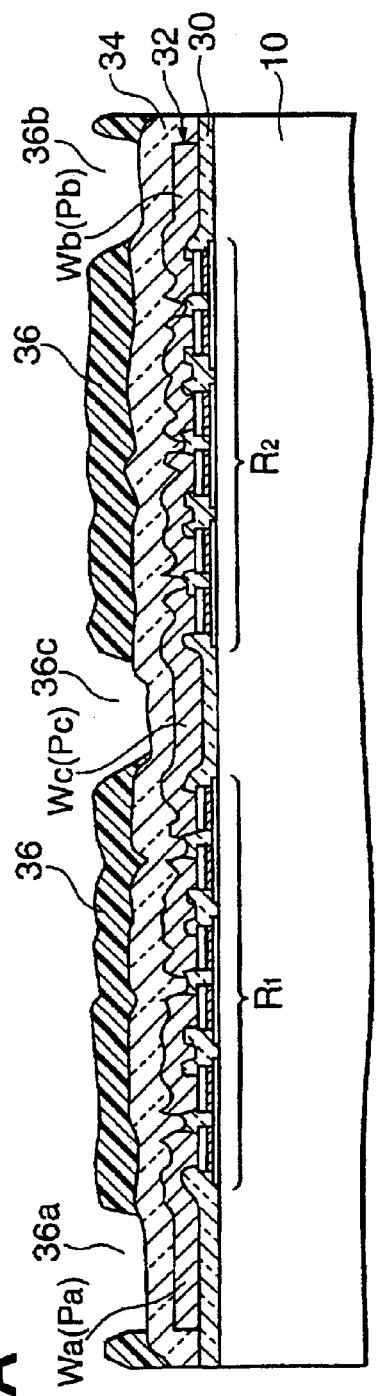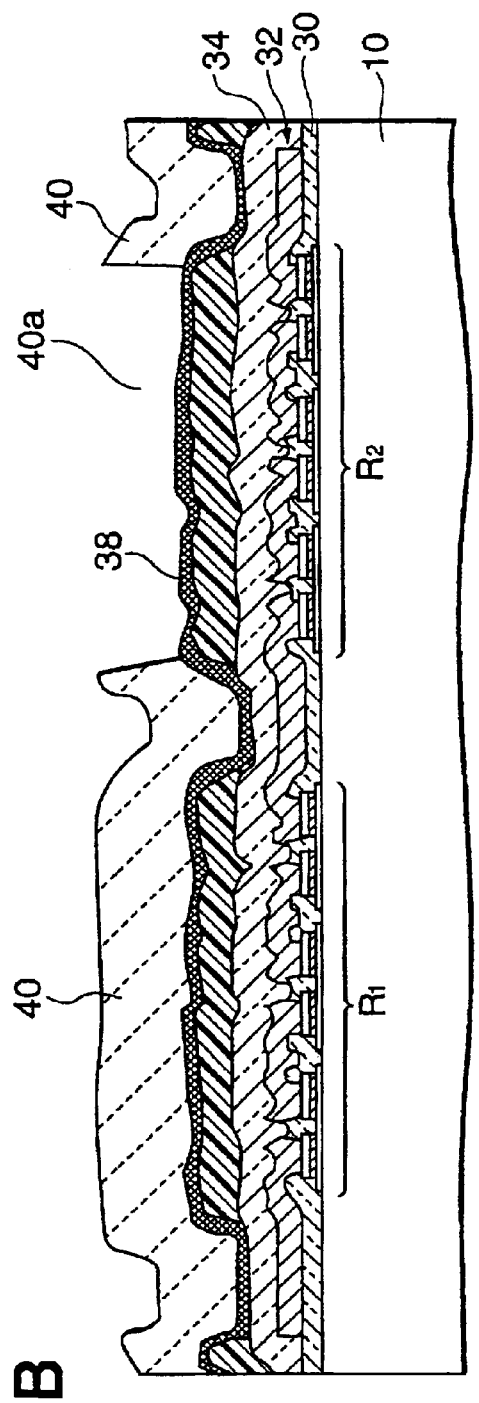
FIG. 3A
FIG. 3B

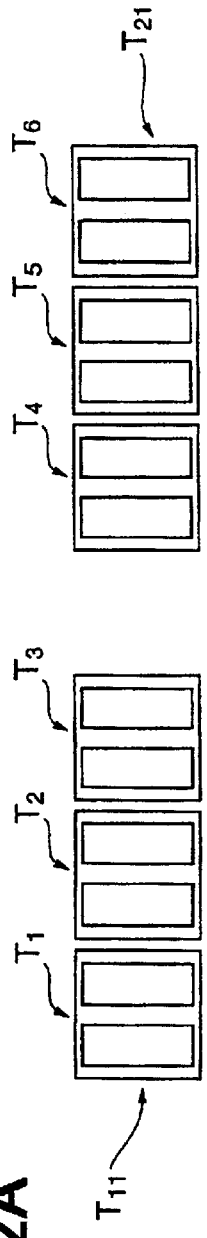
FIG. 12A
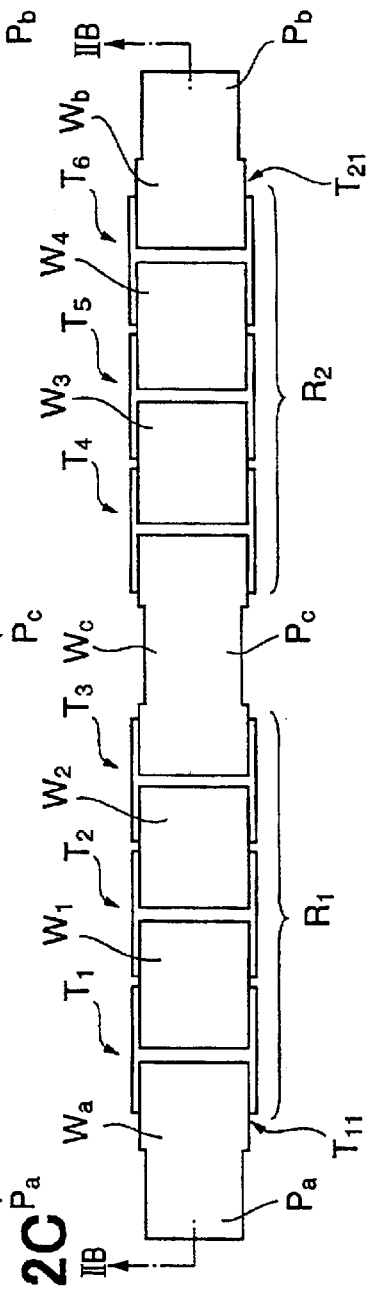
FIG. 12B
FIG. 12C

MAGNETIC SENSOR AND MANUFACTURING METHOD THEREFOR

CROSS REFERENCE TO RELATED APPLICATIONS

This application is based on and incorporates herein by reference Japanese Patent Applications No. 2001-63524 filed on Mar. 7, 2001 and No. 2002-32565, filed on Feb. 8, 2002.

FIELD OF THE INVENTION

The present invention relates to a magnetic sensor using magnetic tunnel junction devices as magnetoresistive devices and a manufacturing method therefor.

BACKGROUND OF THE INVENTION

In a magnetic sensor, as shown in FIG. 1B, two magnetoresistive devices $R_1$ and $R_2$ are connected in series on a substrate 10. Each of the magnetoresistive devices $R_1$ and $R_2$ is constructed with one or a series of two or more magnetic tunnel junction devices (TMR devices) and one of the magnetoresistive devices (for example, $R_2$) is magnetically shielded.

In this magnetic sensor, the temperature characteristics of the magnetoresistive devices $R_1$ and $R_2$ are virtually identical. Therefore, when a given voltage is applied between electric terminals Pa and Pb at one end and the other of the serial path of the magnetoresistive devices $R_1$ and $R_2$ and no external magnetic field is applied into the plane of the substrate 10, a constant output voltage is produced between the electric terminals Pc and Pb (or Pa and Pc) at both ends of the magnetoresistive device $R_2$ (or $R_1$) regardless of the temperature. The constant output voltage is, for example, Vin/2, where Vin represents the voltage between the terminals Pa and Pb.

When an external magnetic field is applied to the plane of the substrate 10, the electric resistance of the magnetoresistive device $R_1$ varies depending on the orientation and magnitude of the magnetic field. Thus the output voltage between the terminals Pc and Pb (or Pa and Pc) varies as the electric resistance changes. In the TMR devices which constitute the magnetoresistive devices $R_1$ and $R_2$, the change in resistance is very small even when the ambient temperature varies with an external magnetic field. Consequently, this magnetic sensor shows a favorable temperature characteristic.

However, in the manufacturing process, when fixing the chip to a lead frame, the chip is likely to crack at the portion covered by a magnetic shield layer 42 due to changes of temperature from a heat treatment temperature level to a room temperature level.

SUMMARY OF THE INVENTION

It is an object of the present invention to provide a magnetic sensor which is least likely to cause cracking and a manufacturing method therefor.

According to the present invention, magnetoresistive devices are formed on the insulating surface of a substrate. The devices are connected in series through an insulating film using a wiring layer formed on the surface of the substrate. An insulating film for passivation is formed to cover the devices and the wiring layer. A magnetic shield layer is formed on the passivation insulating film through an organic film for relieving thermal stress to cover one of the devices. After removal of the sensor chip containing the magnetoresistive devices and other components from the wafer, the chip is bonded to a lead frame through an Ag paste layer by heat treatment. Preferably, the magnetic shield layer is made of a Ni—Fe alloy having a Ni content of 69% or less.

BRIEF DESCRIPTION OF THE DRAWINGS

The above and other objects, features and advantages of the present invention will become more apparent from the following detailed description made with reference to the accompanying drawings: In the drawings:

FIG. 3A is a sectional view showing a step of forming an organic film for the magnetic sensor, and FIG. 3B is a sectional view showing a step of forming a shield layer and the step of forming a resist layer of the magnetic sensor;

FIG. 12A is a top view showing the layout of TMR device pairs, FIG. 12B is a top view showing an example of a magnetic sensor using the groups of TMR devices shown in FIG. 12A, and FIG. 12C is a top view showing another example of a magnetic sensor using the groups of TMR devices shown in FIG. 12A;

DETAILED DESCRIPTION OF THE PREFERRED EMBODIMENTS (First Embodiment)

Figure 1A:
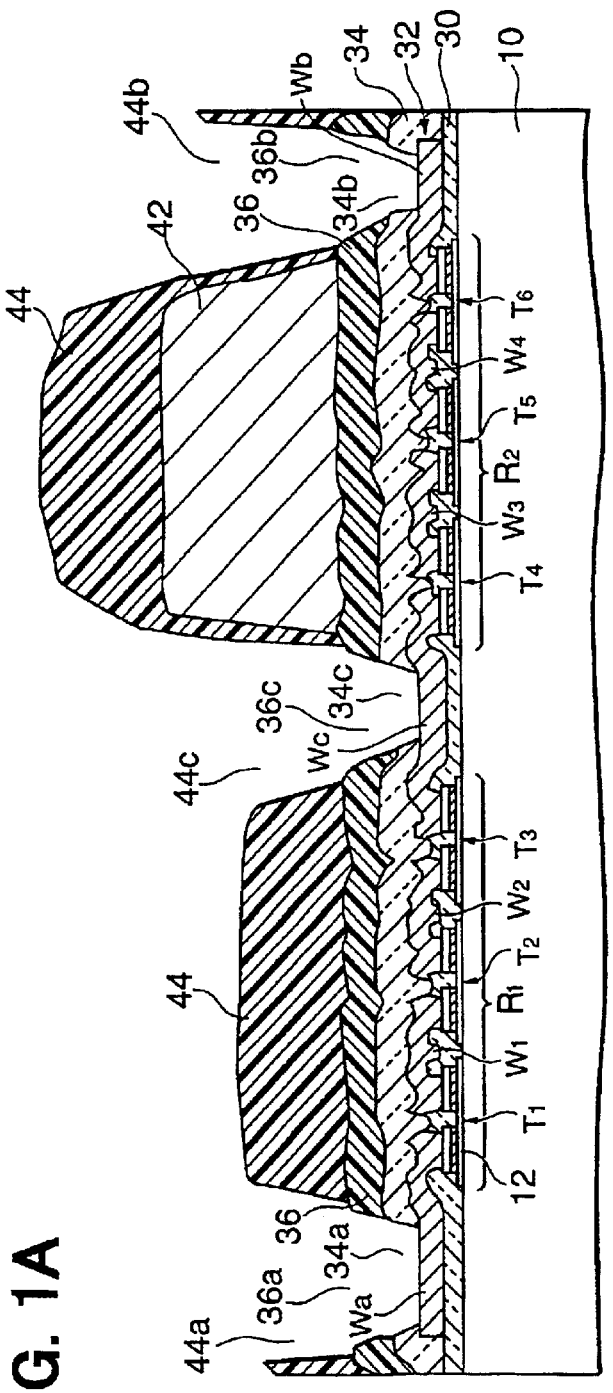
FIG. 1A is a sectional view showing a magnetic sensor according to a first embodiment of the present invention.
Figure 1B:
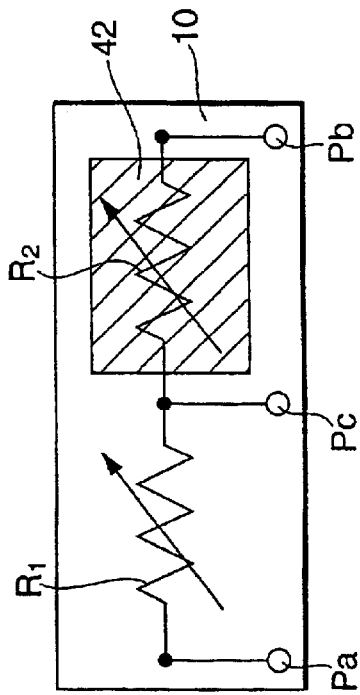
FIG. 1B is an equivalent circuit diagram of the magnetic sensor.

Referring first to FIG. 1A, a magnetic sensor according to the first embodiment has magnetoresistive devices $R_1$ and $R_2$ arranged in series on the insulating surface of a substrate 10 as illustrated in FIG. 1B. Each of the magnetoresistive devices is constructed with a plurality of TMR devices arranged in series. $T_1$ to $T_6$ represent TMR device pairs each of which is constructed with a pair of TMR devices connected in series through a lower electrode layer 12 as typically observed in $T_1$. The device pairs $T_1$ to $T_6$ are virtually identical in structure and the method for forming the TMR devices will be described later. It is also possible that each magnetoresistive device $R_1$ or $R_2$ comprises a single TMR device.

An interlayer insulating film 30 of silicon oxide or a similar material is formed on the surface of the substrate 10, covering the TMR device pairs $T_1$ to $T_6$. Also, a wiring layer 32 including Al layers Wa to Wc and $W_1$ to $W_4$ is formed on the insulating film 30. The Al layer Wa is led out from one TMR device of the device pair $T_1$. A part of the Al layer Wa constitutes an electric terminal or bonding pad Pa shown in FIG. 1B. The Al layer $W_1$ interconnects the other TMR device of the pair $T_1$ and one TMR device of the pair $T_2$, and the Al layer $W_2$ interconnects the other TMR device of the pair $T_2$ and one TMR device of the pair $T_3$. The Al layer Wc is led out from the other TMR device of the device pair $T_3$. A part of the Al layer Wc constitutes an electric terminal or bonding pad Pc shown in FIG. 1B. In this way, the magnetoresistive device $R_1$ between bonding pads Pa and Pc is constructed with TMR device pairs $T_1$ to $T_3$ connected in series.

The Al layer Wc interconnects the other TMR device of the device pair $T_3$ and one TMR device of the device pair $T_4$. The Al layer $W_3$ interconnects the other TMR device of the device pair $T_4$ and one TMR device of the device pair $T_5$. The Al layer $W_4$ interconnects the other TMR device of the device pair $T_5$ and one TMR device of the device pair $T_6$. The Al layer Wb is led out from the other TMR device of the device pair $T_6$. A part of the Al layer Wb constitutes an electric terminal or bonding pad Pb shown in FIG. 1B. In this way, the magnetoresistive device $R_2$ between bonding pads Pc and Pb is constructed with TMR device pairs $T_4$ to $T_6$ connected in series. Bonding pad Pc is led out from the portion of interconnection of the magnetoresistive devices $R_1$ and $R_2$.

On the surface of the substrate 10, an insulating film 34 is provided for passivation covering the insulating film 30 and wiring layer 32. The insulating film 34 is, for example, a silicon oxide film, silicon nitride film or a lamination of these films. The insulating film 34 has connecting holes 34a, 34b and 34c which expose the bonding pads of the wiring layers Wa, Wb and Wc.

On the insulating film 34, an organic film 36 is provided for relieving thermal stress. The organic film 36 is, for example, a polyimide film, resist film or benzocyclobutene film. It has, for example, a thickness of 0.5–1.0 μm or so. It has connecting holes 36a, 36b and 36c, which are continuous with the connecting holes 34a, 34b, 34c of the insulating film 34, respectively.

On the organic film 36, a magnetic shield layer 42 is provided to cover the magnetoresistive device $R_2$ through the organic film 36 and the insulating film 34. The magnetic shield layer 42 is made of a high-permeability magnetic material such as Ni—Fe alloy.

On the organic film 36, an organic film 44 is provided to cover the magnetic shield layer 42. The organic film 44 is, for example, a polyimide film, resist film or benzocyclobutene film. Usually, its thickness is equal to or larger than the thickness of the magnetic shield film 42, for example, 10 μm. The organic film 44 has connecting holes 44a, 44b and 44c, which are continuous with the connecting holes 36a, 36b, 36c of the insulating film 36, respectively.

In this embodiment, each of the connecting holes 34a to 34c is a square of 100 μm×100 μm; the connecting holes 36a to 36c are slightly larger than the connecting holes 34a to 34c; and the connecting holes 44a to 44c are slightly larger than the connecting holes 34a to 34c. Therefore, the connecting holes for the respective bonding pads are somewhat fan-shaped with a gradual outward increase in size, which facilitates bonding of wires of Au or a similar material to the bonding pads. It is desirable to use an electrically insulating material for the organic films 36 and 34 in order to prevent shorting of wires during wire bonding work.

The substrate (magnetic sensor chip) 10 shown in FIG. 1A is separated from the wafer by dicing. The other main surface (reverse) of the chip, or the surface reverse to the surface where the magnetoresistive devices $R_1$ and $R_2$, the magnetic shield layer 42 and so on are formed, is fixed to a Cu lead frame through an Ag paste layer by heat treatment.

While the temperature is decreasing from a heat treatment temperature level to a room temperature level, the organic film 36 relieves thermal stress caused by the difference in the thermal expansion coefficient between the chip and the magnetic shield layer 42, which prevents cracking in the chip at its portion covered by the magnetic shield layer 42.

After the above wire bonding following the step of fixing the chip to the lead frame, the chip, the chip support of the lead frame and bonding wires may be housed in a plastic package by a resin molding process. If the filler in the resin and the magnetic shield layer repeatedly expand and contract due to temperature changes during the resin molding process or a subsequent process, the magnetic shield layer 42 may peel off the organic film 36. Such peeling can be prevented by the organic film 44.

Next, a method for manufacturing the magnetic sensor will be described with reference to FIGS. 2A–2C to FIG. 19.

Figure 2A:
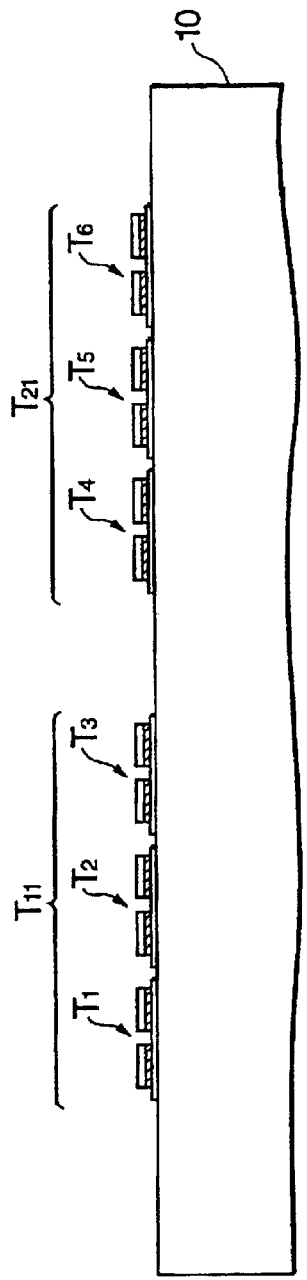
FIG. 2A is a sectional view showing a step of forming groups of TMR devices of the magnetic sensor.

First as shown in FIG. 2A, a TMR device group $T_{11}$ including TMR device pairs $T_1$ to $T_3$ and a TMR device group $T_{21}$ including TMR device pairs $T_4$ to $T_6$ are formed on the surface of the substrate 10. The TMR device group pattern may be like the one shown in FIG. 7. In this pattern, the same TMR device groups $T_{12}$ to $T_{15}$ as the TMR device group $T_{11}$ are arranged in line with $T_{11}$ and the same TMR device groups $T_{22}$ to $T_{25}$ as the TMR device group $T_{21}$ are arranged in line with $T_{21}$. This pattern may be changed as shown in FIG. 12A which includes only the device groups $T_{11}$ and $T_{21}$.

In the device groups $T_{11}$ to $T_{15}$ and $T_{21}$ to $T_{25}$, their TMR device pairs are virtually identical in structure, so as a typical example, a method for manufacturing the TMR device pair $T_1$ will be explained referring to FIGS. 8 to 10.

Figure 8:
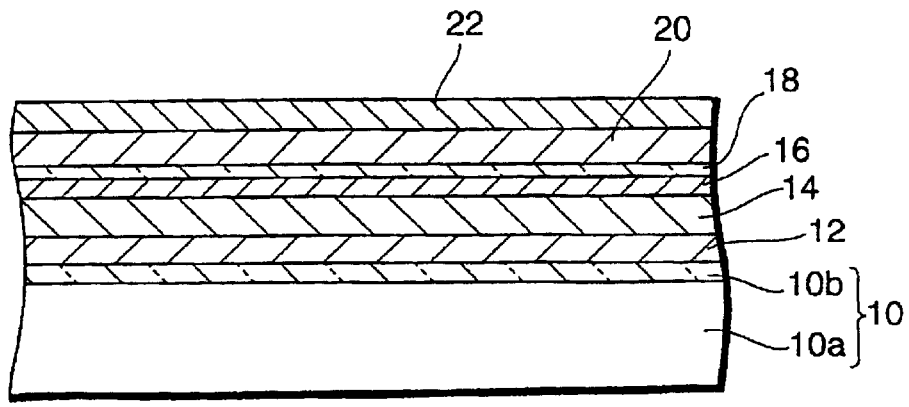
FIG. 8 is a sectional view taken along the line VIII—VIII in FIG. 7 showing the film forming step in the TMR device pair forming process.

At step shown in FIG. 8, the insulating substrate 10 is prepared by forming a silicon oxide film 10b on the surface of a silicon substrate 10a by thermal oxidation. The substrate 10 may be an insulating substrate made of glass, quartz or the like. A 10–30 nm thick Cr layer as the electrode material layer 12 is formed on the insulating surface of the substrate 10 by sputtering. The electrode material layer 12 may be a single Ti layer or a lamination of a Ti layer and a Cu layer, or an insulating nonmagnetic metal material such as W, Ta, Au or Mo may be used.

Next, a 30–50 nm thick layer of Pt—Mn alloy 14 is formed as an anti-ferromagnetic layer on the layer 12 by sputtering. The material for the anti-ferromagnetic layer may be a Rh—Mn alloy, Fe—Mn alloy or the like. Then, a 10 nm thick Ni—Fe alloy layer 16 is formed as a ferromagnetic layer on the Pt—Mn alloy layer 14 by sputtering. The material for this ferromagnetic layer may be Ni, Fe or Co or an alloy of two or more metals among Ni, Fe and Co or an intermetallic compound. A multilayered structure such as a lamination of an upper Ni—Fe alloy layer and a lower Co layer may be used as well.

Then, a 1–2 nm thick Al layer is formed on the Ni—Fe alloy layer 16 by sputtering. An alumina ($AlO_x$) layer 18 is formed by oxidizing the Al layer. The alumina layer 18 is used as a tunnel barrier layer. For the tunnel barrier layer, an oxide as a modified form of metal or semiconductor (e.g., TiOx, $SiO_2$, MgO, $Al_2O_3+SiO_2$ [SIALON]) or a nitride (e.g., AlN, $Si_3N_4$), or an oxide nitride (e.g., $AlN+Al_2O_3$) may be used.

Next, a 20–100 nm thick Ni—Fe alloy layer 20 is formed as a ferromagnetic layer on the alumina layer 18 by sputtering. Instead of this ferromagnetic layer 20, a ferromagnetic layer similar to the one used for the layer 16 may be used. Then, a 30–60 nm thick Mo layer 22 is formed on the Ni—Fe alloy layer 20 by sputtering. The Mo layer 22 is used to form an upper electrode layer, and it also serves as an etching stopper at the step of forming connecting holes for the Al layer (Wa, etc. in FIG. 1A) in the insulating film 30 by etching.

Figure 9:
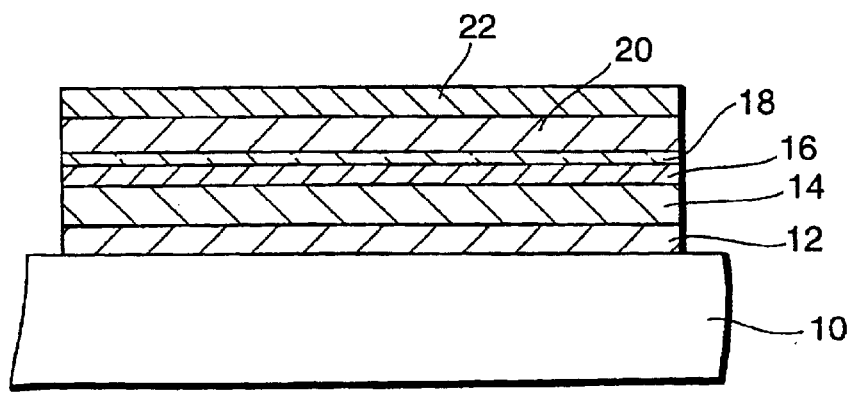
FIG. 9 is a sectional view showing a step of ion milling which follows the step shown in FIG. 8.

At step shown in FIG. 9, the lamination ranging from the Cr layer 12 to the Mo layer 22 is patterned by ion milling using a resist layer as a mask in accordance with a predetermined lower electrode pattern. Then the resist layer used for this patterning is removed.

Figure 10:
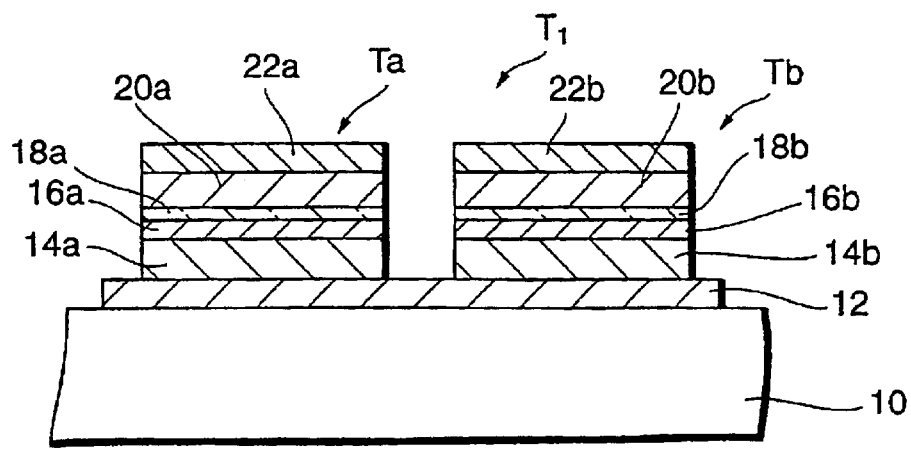
FIG. 10 is a sectional view showing a step of ion milling which follows the step shown in FIG. 9.

At step shown in FIG. 10, the lamination ranging from the Pt-Mn alloy layer 14 to the Mo layer 22 is patterned by ion milling using a resist layer as a mask in accordance with two predetermined upper electrode patterns. Then the resist layer used for this patterning is removed. As a consequence, the first TMR device Ta and the second TMR device Tb are produced. The first TMR device Ta is a lamination constituted of the Cr layer 12, Pt—Mn alloy layer 14a, Ni—Fe alloy layer 16a, alumina layer 18a, Ni—Fe alloy layer 20a and Mo layer 22a. The second TMR device Tb is a lamination constituted of the Cr layer 12, Pt—Mn alloy layer 14b, Ni—Fe alloy layer 16b, alumina layer 18b, Ni—Fe alloy layer 20b and Mo layer 22b. These devices Ta and Tb are connected in series by the lower electrode layer (Cr layer) 12 to constitute the TMR device pair $T_1$.

In the TMR device pair $T_1$ shown in FIG. 10, the Pt—Mn alloy layers 14a and 14b function to fix the orientation of magnetization in the Ni—Fe alloy layers 16a and 16b, respectively. As a result, the Ni—Fe alloy layers 16a and 16b are both fixed magnetization layers. On the other hand, the orientation of magnetization in the Ni—Fe alloy layers 20a and 20b is free, and they are free magnetization layers.

When an external magnetic field is applied to the plane of the substrate 10 while a given current is flowing through the space between the upper electrode (Mo) layers 22a and 22b, the relative angle in magnetization between the ferromagnetic layers (between the Ni—Fe alloy layers 16a and 20a, and between the Ni—Fe alloy layers 16b and 20b) varies depending on the orientation and magnitude of magnetization, and the electric resistance between the upper electrode layers 22a and 22b varies with the changes in the relative angle. The resistance is minimum when the orientations of magnetization of the two layers are parallel to each other, while the resistance is maximum when they are antiparallel. Accordingly, the magnetic field can be detected through the resistance changes.

In the TMR device pair $T_1$ shown in FIG. 10, it is also possible that the Pt—Mn alloy layers 14a and 14b lie over the Ni—Fe alloy layers 20a and 20b, respectively. The Ni—Fe alloy layers 20a and 20b are both fixed magnetization layers while the Ni—Fe alloy layers 16a and 16b are free magnetization layers.

Figure 2B:
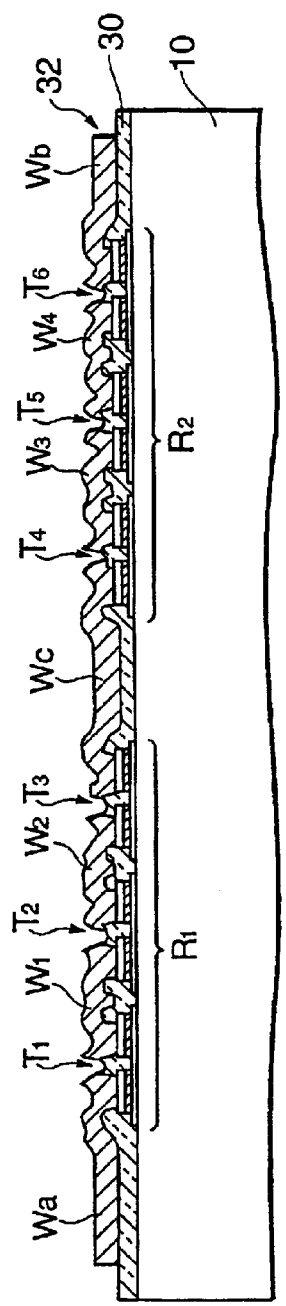
FIG. 2B is a sectional view showing a step of forming wire connections of the magnetic sensor.

At step shown in FIG. 2B, the interlayer insulating film 30 which covers the TMR device groups such as $T_{11}$ and $T_{21}$ is formed over the surface of the substrate 10. For example, a silicon oxide layer is formed as the insulating film 30 by sputtering. Connecting holes necessary for wiring are formed in the insulating film 30 by ion milling using a resist layer as a mask. Then, an Al layer is formed on the insulating film 30 by sputtering and the Al layer is patterned by wet etching using a resist layer as a mask to form the wiring layer 32, which includes the remaining Al layer portions Wa to Wc and $W_1$ to $W_4$.

Figure 7:
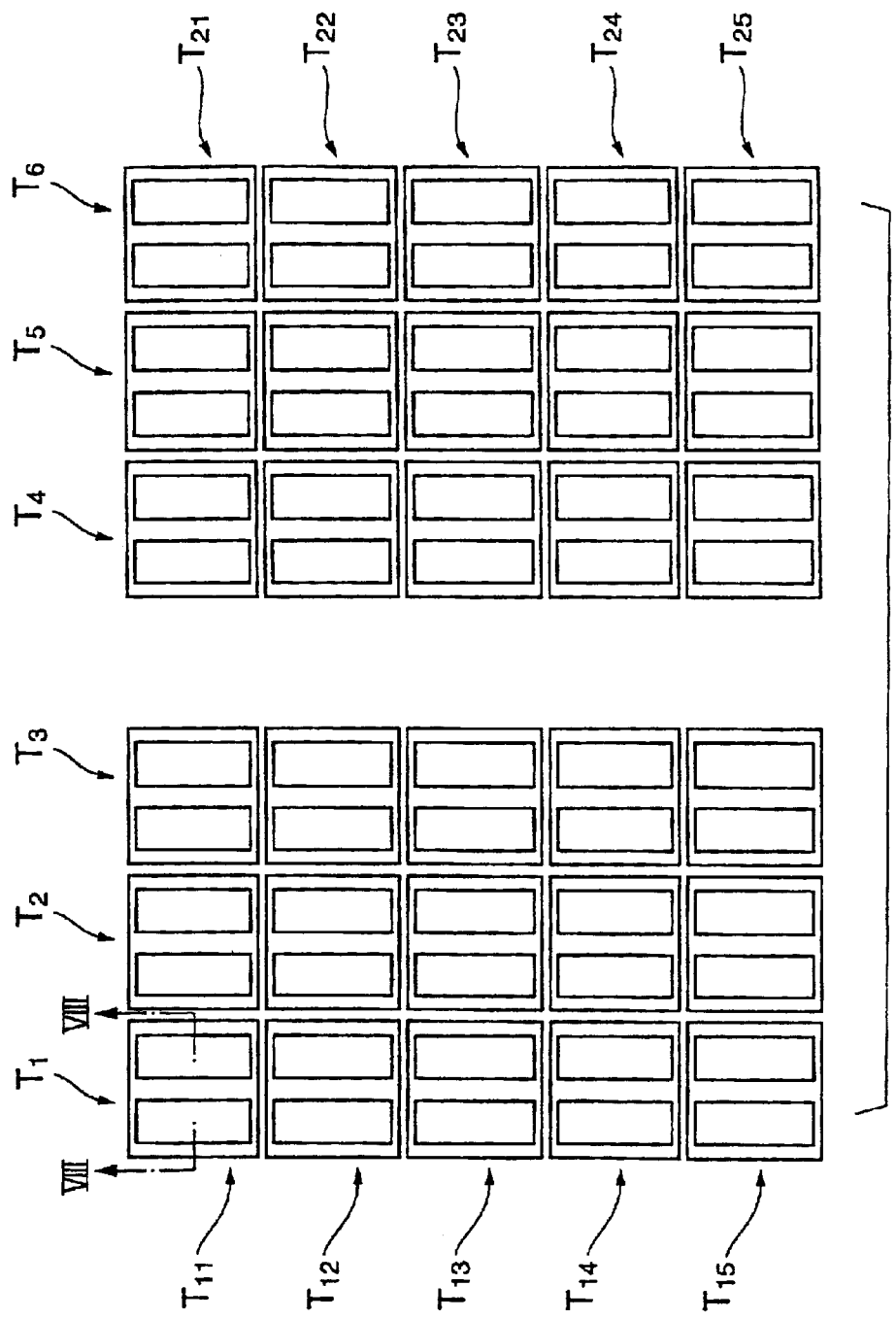
FIG. 7 is a top view showing the groups of TMR devices shown in FIG. 2A.
Figure 11:
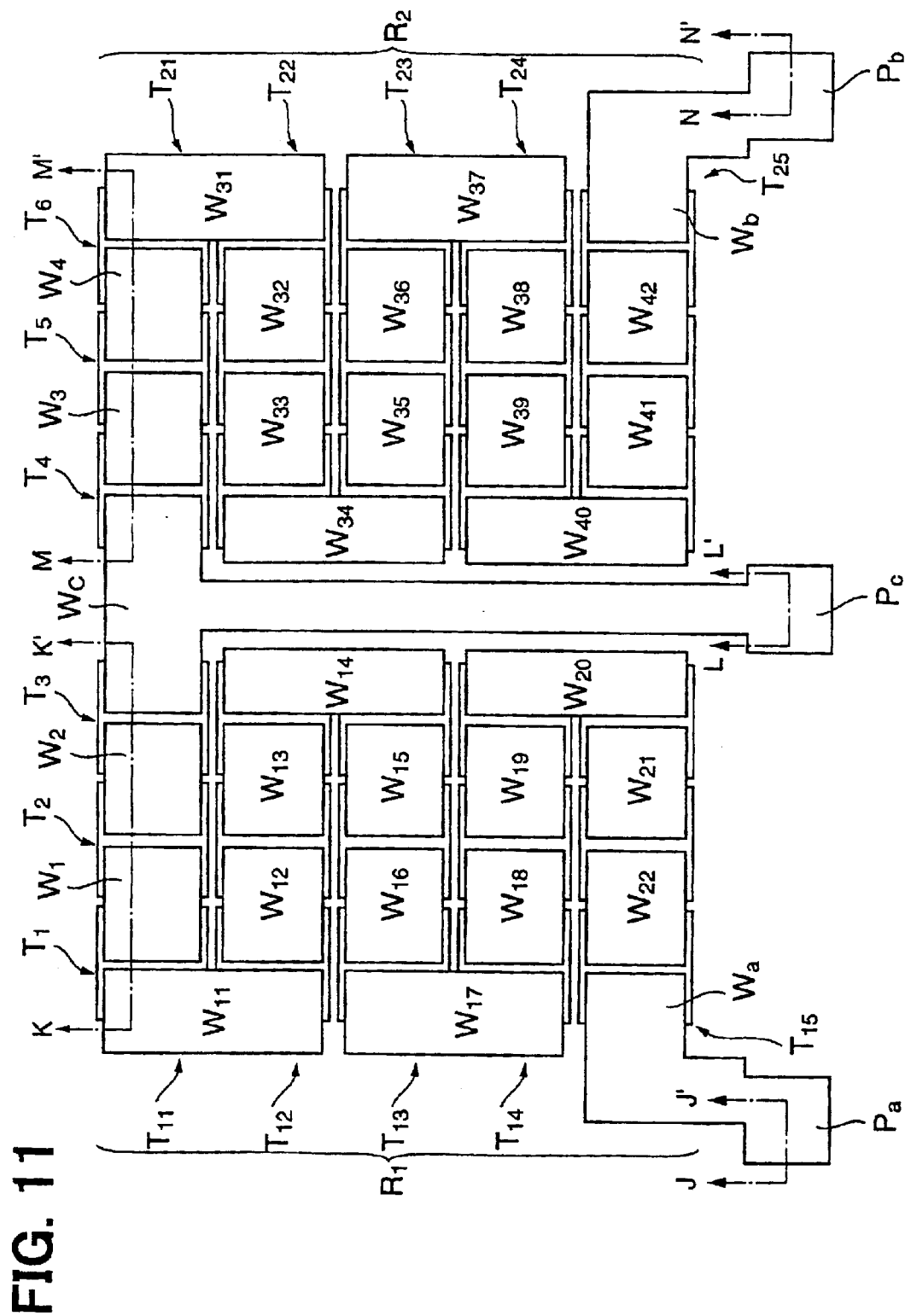
FIG. 11 is a top view showing the magnetic sensor shown in FIG. 2B.

If the TMR device group pattern shown in FIG. 7 is adopted, the pattern shown in FIG. 11 can be used as a wiring pattern. In the case of the pattern shown in FIG. 11, connections of the TMR device pairs $T_1$ to $T_3$ (TMR device group $T_{11}$) and TMR device pairs $T_4$ to $T_6$ (TMR device group $T_{21}$) by the Al layers $W_1$, $W_2$, Wc, $W_3$ and $W_4$ are made in the same manner as described by reference to FIG. 1. TMR device groups $T_{12}$ to $T_{15}$ are connected in series between the Al layer Wa integral with the bonding pad Pa, and the TMR device group $T_{11}$. TMR device groups $T_{22}$ to $T_{25}$ are connected in series between the Al layer Wb integral with the bonding pad Pb, and the TMR device group $T_{21}$. Here, $W_{11}$ to $W_{22}$ represent Al layers used for serial connection of TMR device groups $T_{11}$ to $T_{15}$ and $W_{31}$ to $W_{42}$ represent Al layers used for serial connection of TMR device groups $T_{21}$ to $T_{26}$.

The magnetoresistive device $R_1$ is constructed with serially connected TMR device groups $T_{11}$ to $T_{15}$, while the magnetoresistive device $R_2$ is constructed with serially connected TMR device groups $T_{21}$ to $T_{25}$. As an extension of the space between the TMR device groups $T_{12}$ to $T_{15}$ and the TMR device groups $T_{22}$ to $T_{25}$, part of the Al layer Wc constitutes a bonding pad Pc which is in line with bonding pads Pa and Pb. For brevity, FIG. 2B shows the cross sections taken along the lines J–J', K–K', L–L', M–M' and N–N' of FIG. 11 in connected form.

If the TMR device group pattern shown in FIG. 12A is adopted, the pattern shown in FIG. 12B or 12C can be used as a wiring pattern. As illustrated in FIG. 12B or 12C, the magnetoresistive device $R_1$ is constructed with TMR device pair $T_1$ to $T_3$ (TMR device group $T_{11}$) while the magnetoresistive device $R_2$ is constructed with TMR device pairs $T_4$ to $T_6$ (TMR device group $T_{21}$). Connections of the TMR device pairs $T_1$ to $T_6$ by the Al layers Wa to Wc and $W_1$ to $W_4$ are made as described above by reference to FIG. 1A. The cross section shown in FIG. 2B corresponds to a cross section taken along the line IIB—IIB in FIG. 12B and also one taken along the line IIB—IIB in FIG. 12C.

Figure 2C:
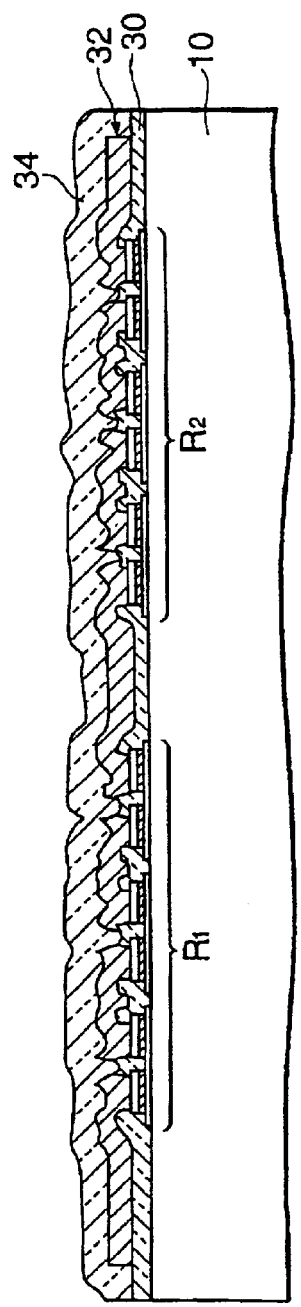
FIG. 2C is a sectional view showing a step of forming an insulating film of the magnetic sensor.

At step shown in FIG. 2C, the insulating film 34 for passivation which covers the wiring layer 32 is formed over the insulating film 30. Preferably a film with high density texture should be used for passivation. One example of the method for forming this film is as follows: a 150 nm thick silicon oxide film is first formed using the plasma CVD method, followed by formation of a 1000 nm thick silicon nitride film. The characteristics of TMR devices deteriorate at 300° C. or more. To avoid such deterioration, 250° C. is used as a film forming temperature in the plasma CVD method.

At step shown in FIG. 3A, the organic film 36 for relief of thermal stress is formed on the insulating film 34. Explanations given in association with the step of FIG. 3A and subsequent steps assume that the TMR device group pattern shown in FIG. 7 is adopted. Covering the magnetoresistive devices $R_1$ and $R_2$ and bonding pads Pa to Pc, the organic film 36 forms a plane pattern shown in FIG. 13.

Figure 13:
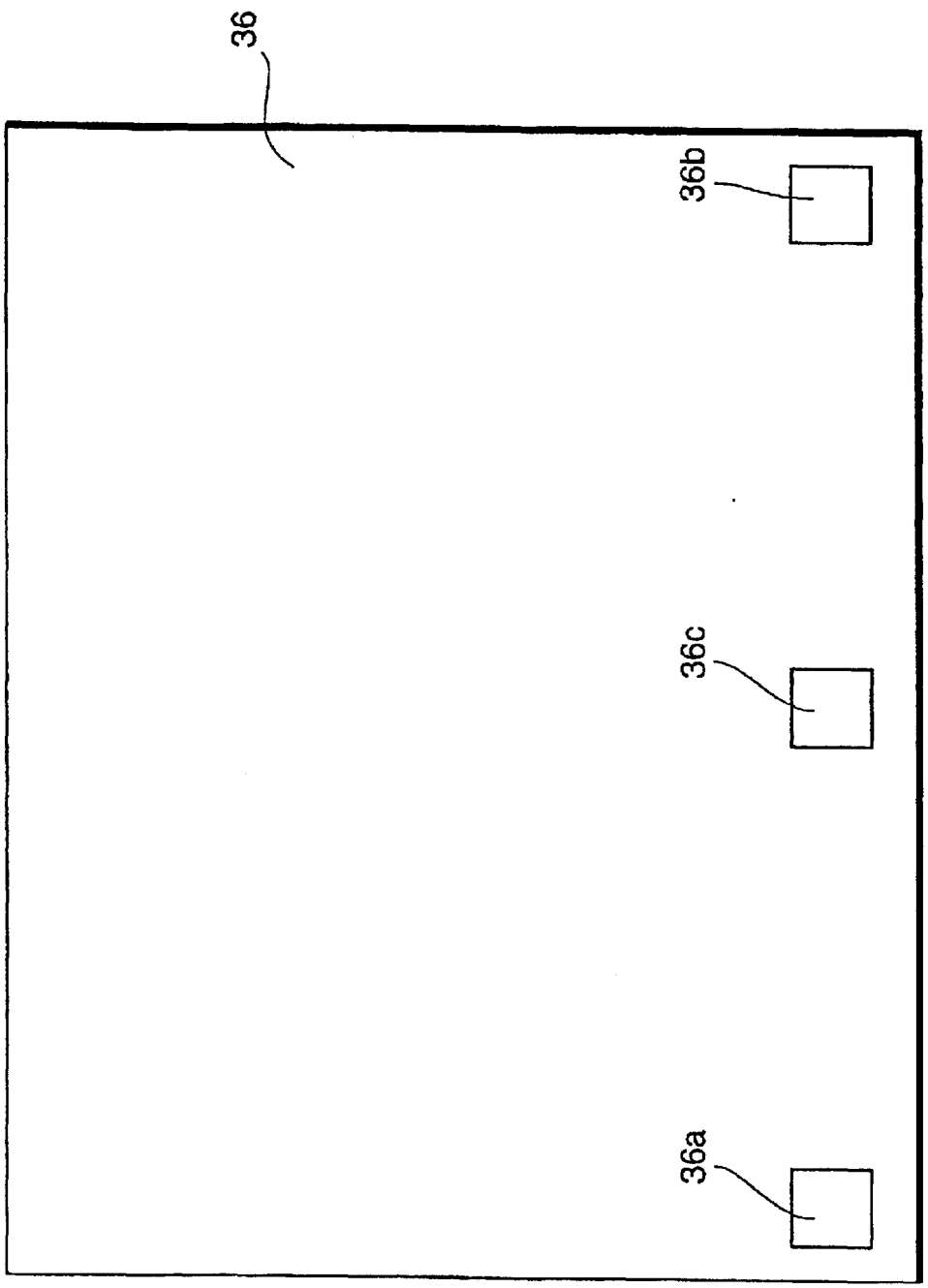
FIG. 13 is a top view showing the organic film shown in FIG. 3A.

As a typical process of preparing the organic film 36, a 0.5–1 μm thick polyimide film is formed. Specifically, polyimide is coated on the upper face of the substrate by a spin coater, and then the coating is pre-baked on a hot plate at 50° C. for 30 minutes and then at 125° C. for 3 minutes. Then a positive resist layer is formed on the pre-baked polyimide film by rotary coating or a similar method. This positive resist layer is subjected to exposure and development to form three holes corresponding to the connecting holes 36a to 36c. As a result of this development process, three holes are formed in the positive resist layer and the polyimide film is etched by the developing solution with the positive resist layer as a mask so that the connecting holes 36a to 36c are formed in the polyimide film as the organic film 36 as shown in FIGS. 3A and 13.

After removal of the positive resist layer, the polyimide layer is set by 1-hour heat treatment at 250° C. to become a film suitable for practical use. In order to avoid such deterioration in TMR device characteristics as described above concerning the plasma CVD process, it is desirable to use a heat treatment temperature of below 300° C. Since the reaction of the polyimide itself is completed at 200° C. or less and the boiling point of the solvent is not more than 210° C., it can be set to an intended degree as far as the heat treatment temperature is 200° C. or more. If a resist film is used as the organic film 36, it may be heat-treated, for example, at 250° C. for one hour. If a benzocyclobutene film is used as the organic film 36, it may be heat-treated, for example, at 230° C. for one hour.

Figure 14:
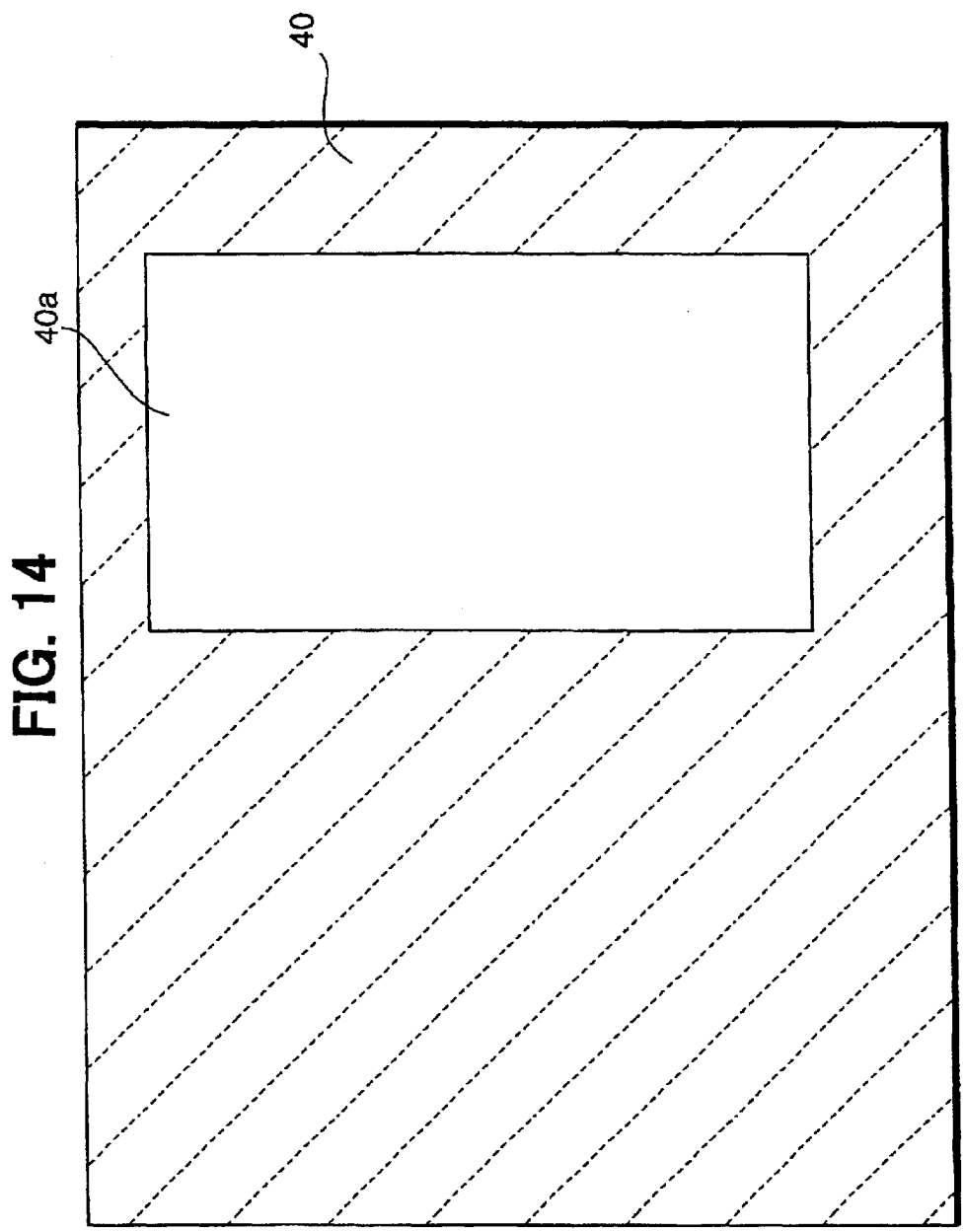
FIG. 14 is a top view showing the resist layer shown in FIG. 3B.

At step shown in FIG. 3B, a seed layer for selective coating which covers the organic film 36 and connecting holes 36a to 36c is formed. A typical process of forming the seed layer 38 is as follows: a lamination layer is formed by laying a 200 nm thick Ni—Fe alloy layer over a 20 nm thick Cr layer by sputtering, then a resist layer 40 is formed on the seed layer 38 to form a plane pattern as illustrated in FIG. 14, where the resist layer should have a hole 40a to expose the part of the seed layer 38 to be coated (which corresponds to the magnetic shield layer 42). The thickness of the resist layer 40 may be, for example, 3 μm.

Figure 4A:
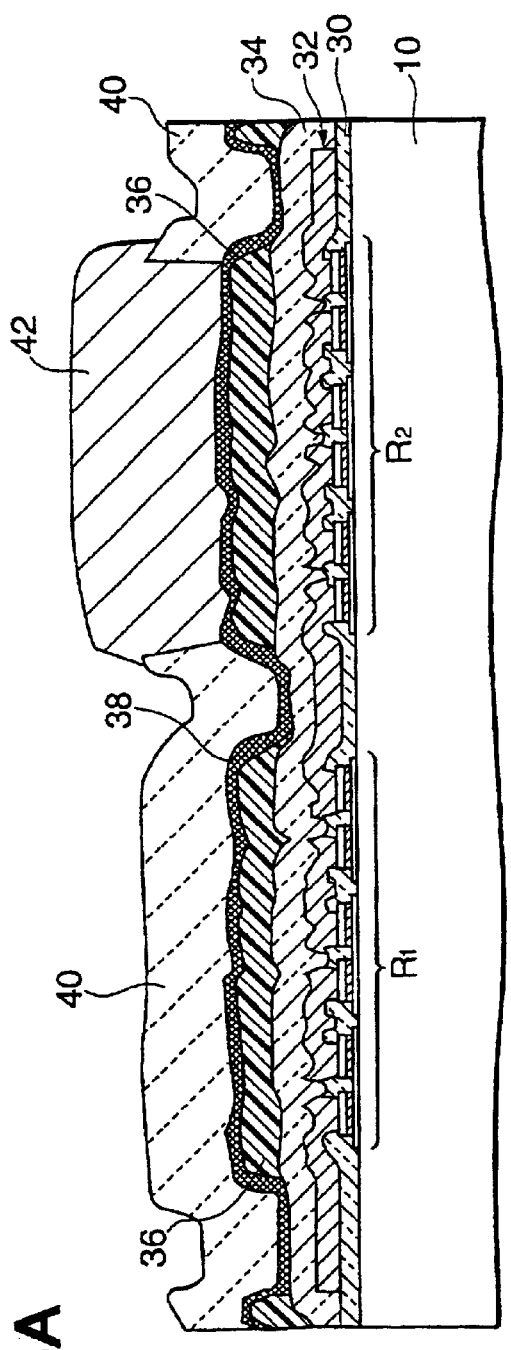
FIG. 4A is a sectional view showing a step of selective coating with a Ni—Fe alloy of the magnetic sensor.
Figure 15:
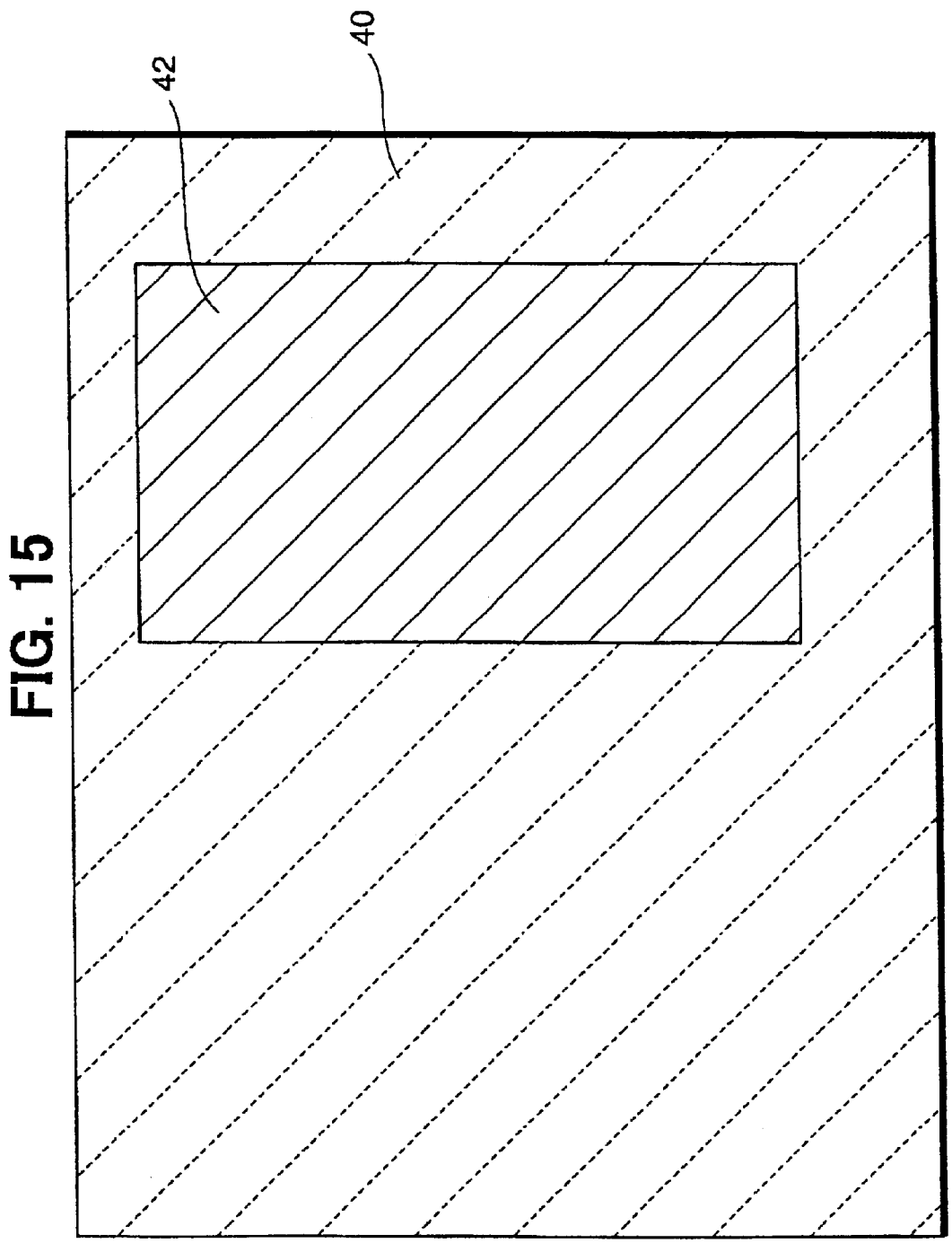
FIG. 15 is a top view showing the resist layer and magnetic shield layer shown in FIG. 4A.

At step shown in FIG. 4A, the magnetic shield layer 42 is formed by selective coating using the resist layer 40 as a mask, to form a plane pattern as illustrated in FIG. 15. A typical method of forming the magnetic shield layer 42 is that a 10 μm thick magnetic layer of Ni—Fe alloy is formed by electrolytic coating. Here, the coating conditions are as follows.

Coating liquid: mixture of nickel sulfate, iron sulfate, boric acid, ammonium chloride, sodium dodecyl sulfate, saccharin sodium and ascorbic acid Temperature: fixed temperature between 45° C. and 60° C.

Current density: 3.5 A/dm$^2$

The thicker the magnetic shield layer 42 is, the larger the shielding effect of is. Therefore, the thickness should be determined depending on the required level of shielding effect. If the magnetic shield layer is thick, the portion of the layer which is above the resist layer may protrude horizontally. To prevent such protrusion, the viscosity of the resist layer 40 should be increased and its thickness should be at least 10 μm.

Figure 4B:
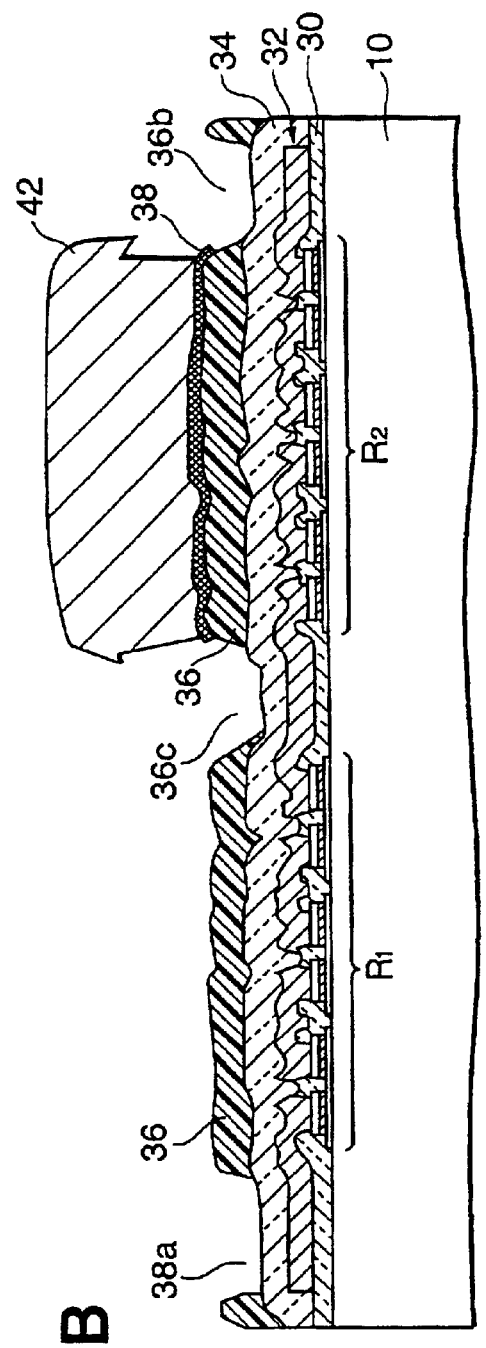
FIG. 4B is a sectional view showing a step of removing the resist layer and a step of selectively removing the shield layer of the magnetic sensor.
Figure 16:
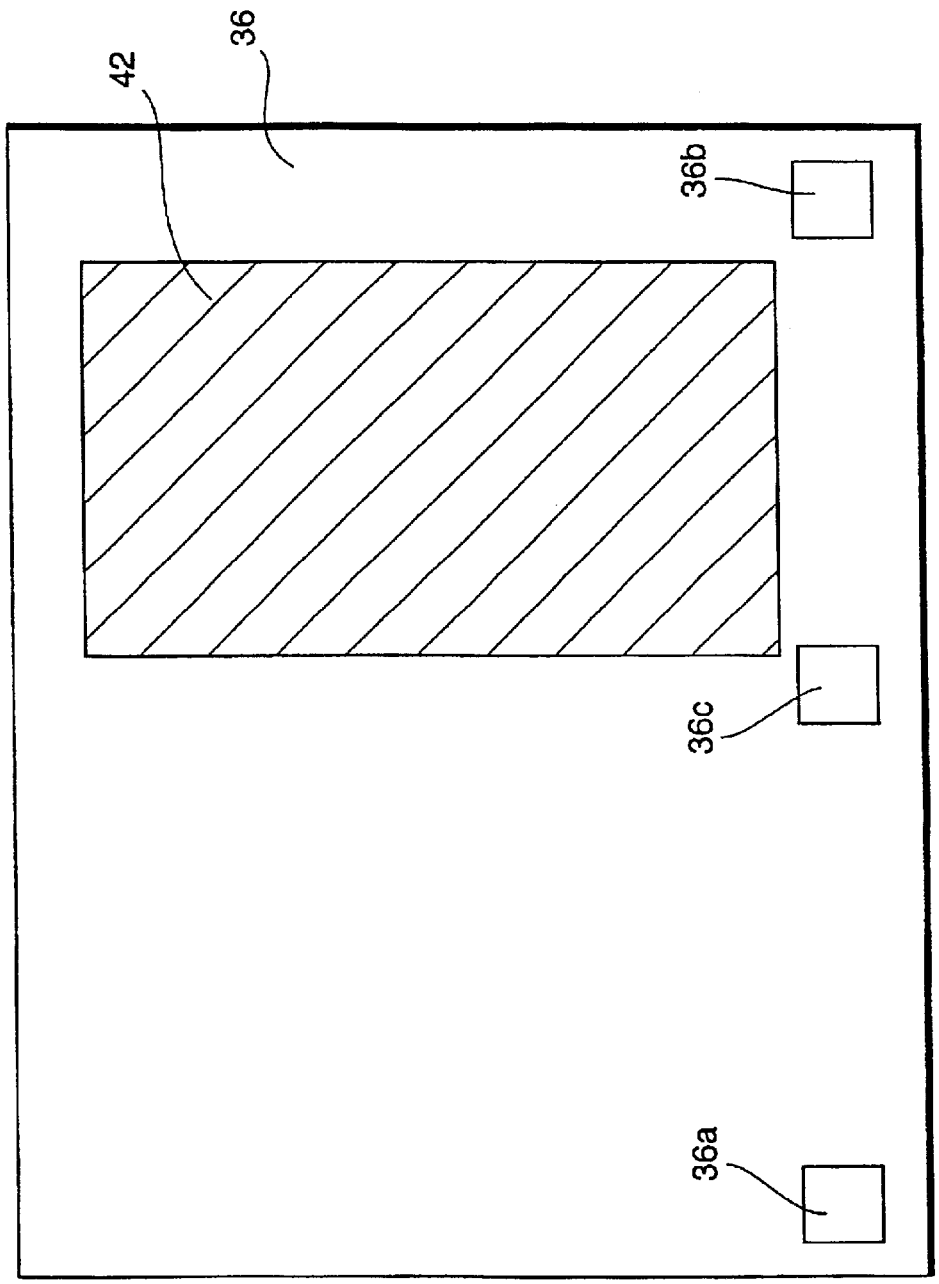
FIG. 16 is a top view showing the organic film and magnetic shield layer shown in FIG. 4B.

At step shown in FIG. 4B, after the resist layer 40 is removed using a resist removing agent such as acetone, portions of the seed layer 38, which are not covered by the magnetic shield layer 42 are removed by ion milling. This removal work may be done by wet etching instead of by ion milling. As a result of the removal step shown in FIG. 4B, the magnetic shield layer 42 remains on the organic film 36 through the remaining portion of the seed layer 38, a plane pattern is formed as illustrated in FIG. 16.

Figure 5:
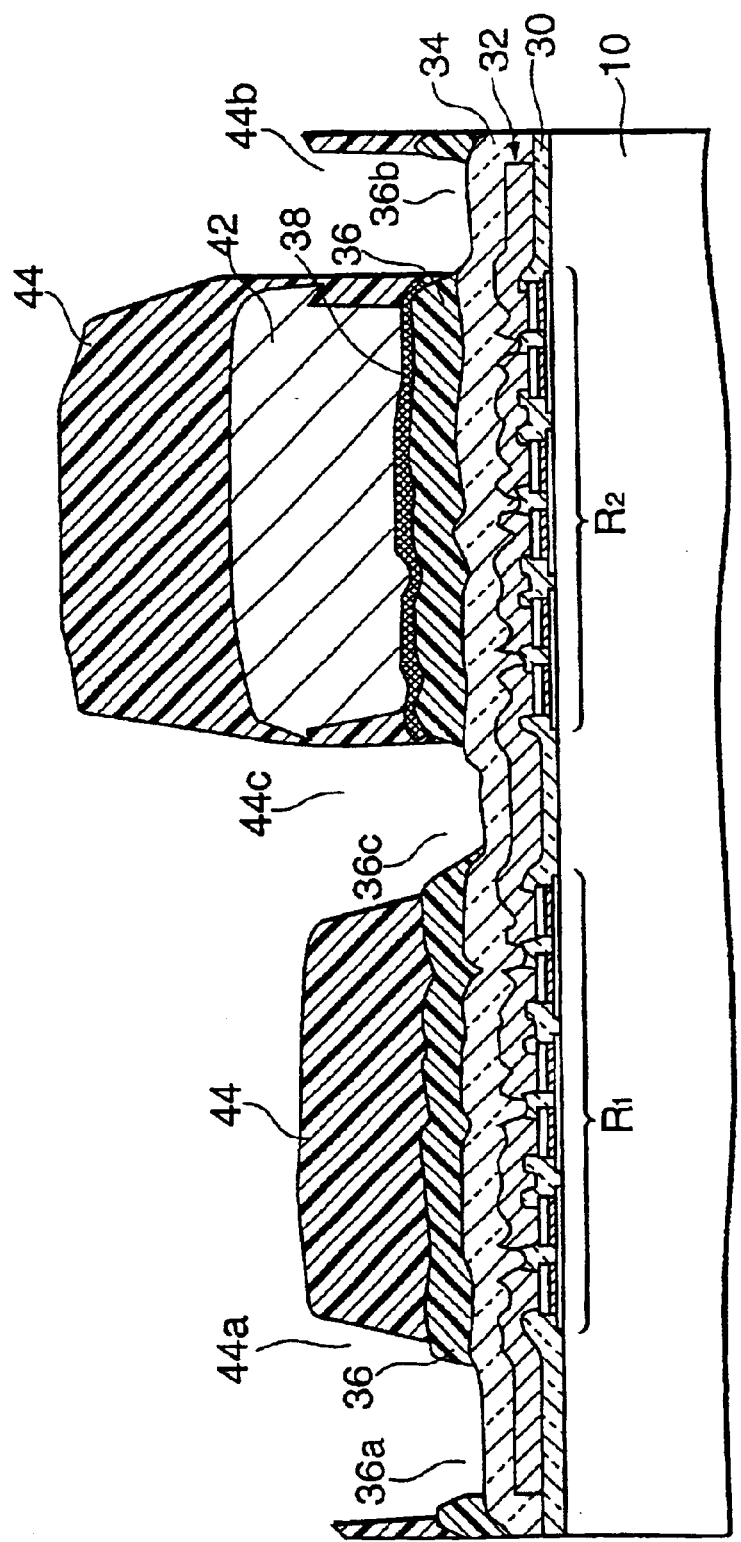
FIG. 5 is a sectional view showing a step of forming an organic film which follows the steps shown in FIG. 4B.
Figure 17:
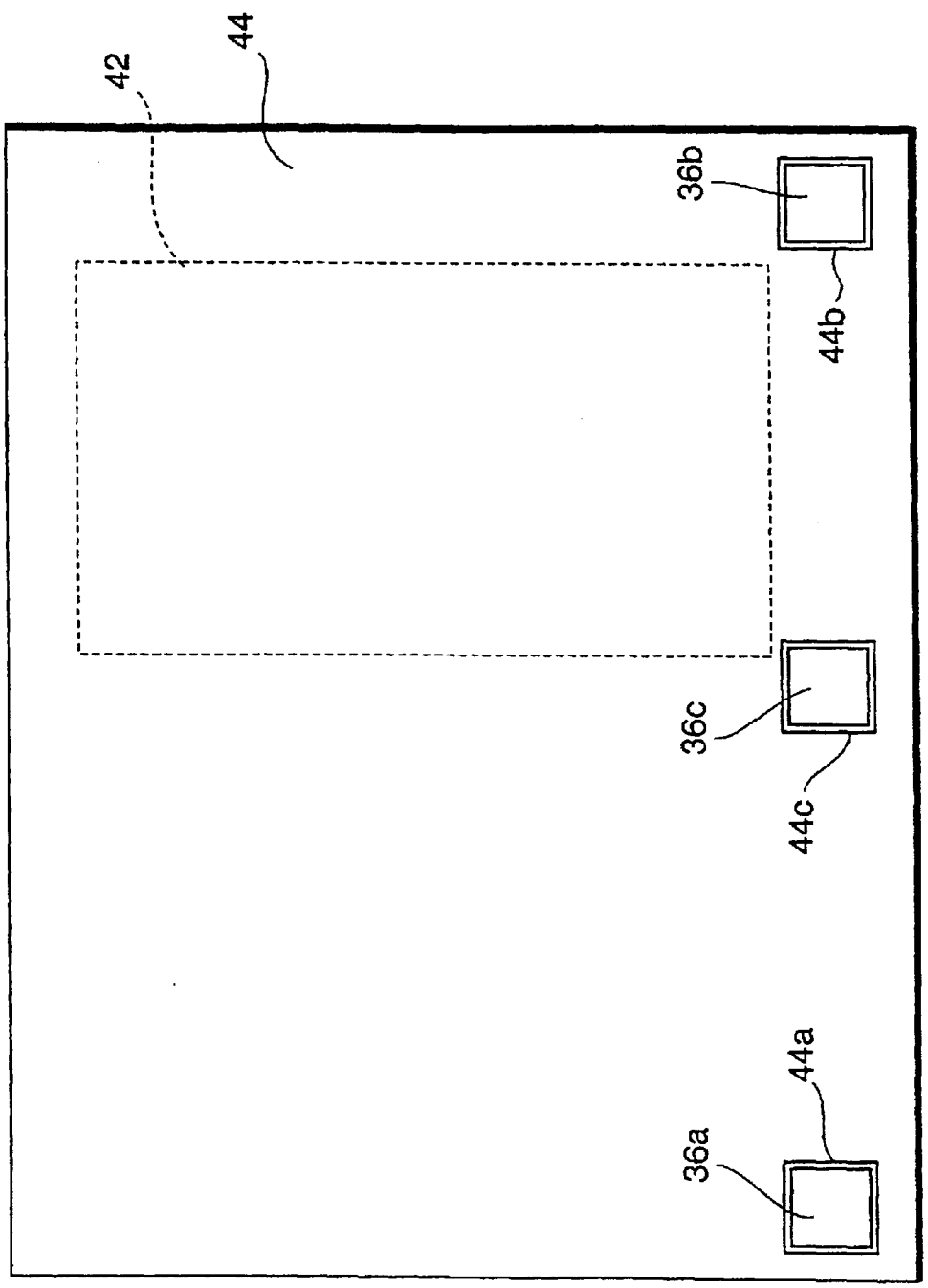
FIG. 17 is a top view showing the organic film covering the magnetic shield layer shown in FIG. 5.

At step shown in FIG. 5, an organic film 44 which covers the magnetic shield layer 42 is formed on the organic film 36 to form a plane pattern as illustrated in FIG. 17. As a typical process of preparing the organic film 44, a 10 μm thick polyimide film is formed in the same manner as described above for the organic film 36. In addition, the connecting holes 44a to 44c as continuous with connecting holes 36a to 36c are formed in the organic film (polyimide film) 44 by etching with the same developing solution as used for development of the positive resist layer formed on the polyimide film, as illustrated in FIGS. 5 and 17.

Figure 6:
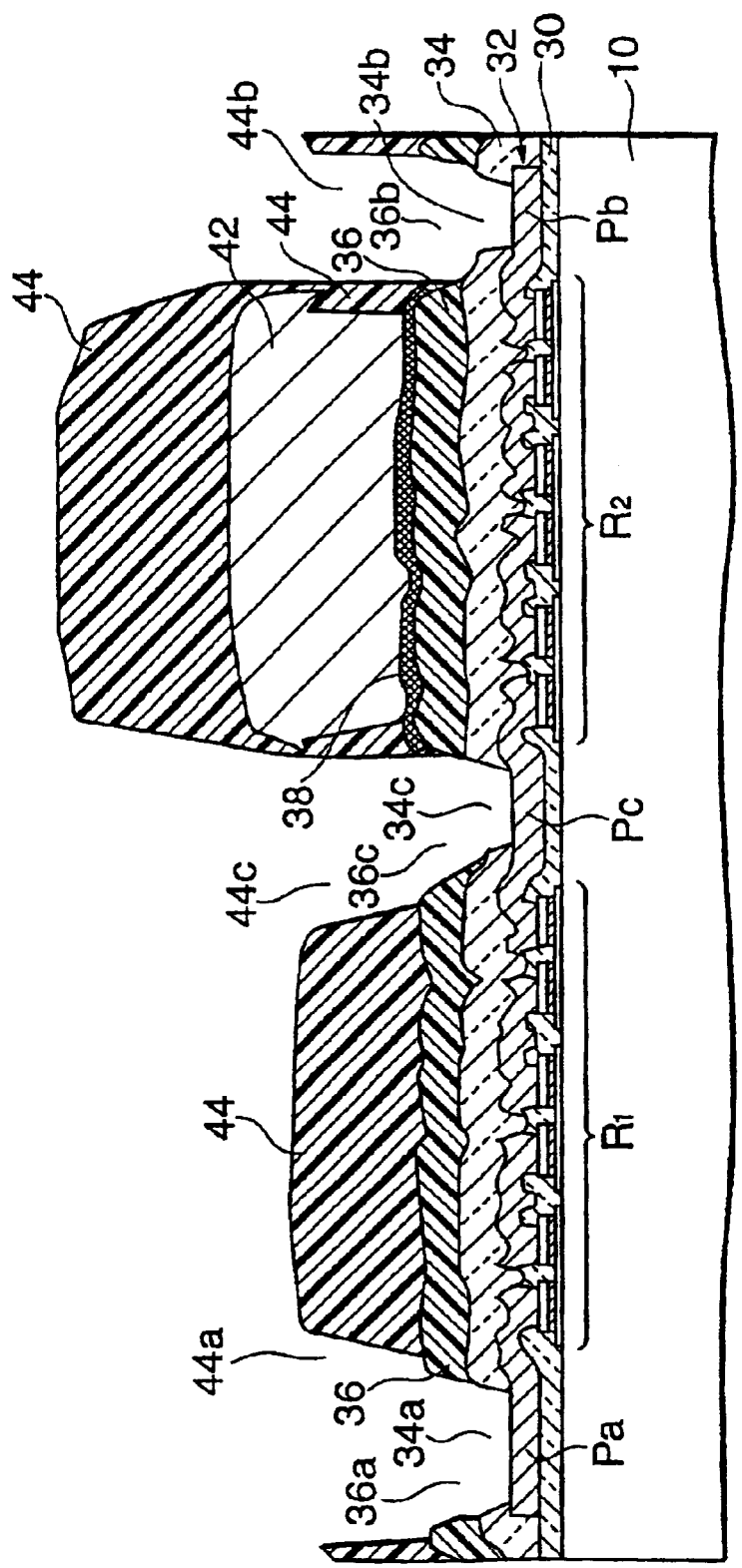
FIG. 6 is a sectional view showing a step of selectively etching an insulating film for passivation which follows the step shown in FIG. 5.

At step shown in FIG. 6, the connecting holes 34a to 34c as the respective continuous with connecting holes 36a to 36c are formed in the insulating film 34 by selective etching with the organic films 36 and 44 as masks. For the selective etching process, the responsive ion etching (RIE) technique is employed. The etching conditions which may be used are given below as an example:

Etching gas: $CF_4$
Pressure: 0.05 Torr
RF power: 240 W/200 mm$\phi$

According to the above magnetic sensor manufacturing method, the connecting holes 36a to 36c are formed before setting of the organic film 36. Therefore, the etching work for forming the connecting holes is easy. In the process from the step of FIG. 3A to the step of FIG. 5, the magnetoresistive devices $R_1$ and $R_2$, wiring layer 32 and bonding pads Pa to Pc are protected by the insulating film 34, so the magnetoresistive devices $R_1$ and $R_2$, wiring layer 32 and bonding pads Pa to Pc are not damaged while the organic films 36 and 44, and the magnetic shield layer 42 are being formed. This implies an improvement in yield rate.

Figure 18:
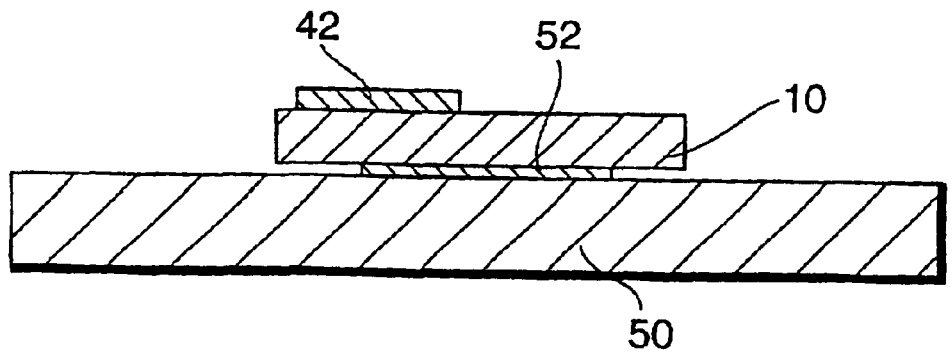
FIG. 18 is a sectional view showing a magnetic sensor chip fixed onto a lead frame.

After the step shown in FIG. 6, the magnetic sensor chip as shown in FIG. 6 is separated from the silicon wafer by dicing. The other main surface (reverse) of the chip, or the surface reverse to the surface where the magnetoresistive devices $R_1$ and $R_2$, the magnetic shield layer 42 and so on are formed, is fixed to a Cu lead frame 50 through an Ag paste layer 52 by heat treatment, as illustrated in FIG. 18. For setting of the Ag paste layer 52, heat treatment is performed at 150° C. for 90 minutes or at 180° C. for 60 minutes depending on the type of Ag paste used.

If, in the magnetic sensor chip shown in FIG. 6, the magnetic shield layer 42 should be formed on the insulating film 34 in the absence of the organic film 36, cracking might occur in the chip at the portion covered by the magnetic shield 42 while the temperature is decreasing from the heat treatment temperature level to a room temperature level. The following is the analysis about the mechanism in which such cracking occurs. Table 1 below shows expansion coefficients of various materials.

TABLE 1

| Material | Coefficient of expansion (/° C.) |
|---|---|
| Si | 2.6–3.6 × $10^{-6}$ |
| $Ni_{81}Fe_{19}$ | 12–13 × $10^{-6}$ |
| Cu | 17 × $10^{-6}$ |
| Fe alloy (42 alloy) | 4.4–7.0 × $10^{-6}$ |
| Au | 23 × $10^{-6}$ |

These materials are used as follows. Silicon (Si) is a material for the substrate of the chip; Ni—Fe alloy ($Ni_{81}Fe_{19}$) is a material for the magnetic shield layer 42; and copper (Cu) is a material for the lead frame 50. The expansion coefficient of Fe alloy (42 alloy) is given here for the purpose of comparison and gold (Au) is a material for the substitute film used instead of the organic film 36 as stated later.

Cu as a material for the lead frame 50 has an expansion coefficient larger than that of Fe alloy (42 alloy), a common lead frame material, and the silicon used for the substrate. For this reason, stress is produced between the lead frame 50 and the silicon substrate of the chip during cooling after Ag paste heat treatment. If other conditions are poor, cracking might occur just because of this stress. When a magnetic shield layer 42 made of $Ni_{81}Fe_{19}$, which has an expansion coefficient larger than that of silicon, is formed on the silicon substrate, stress occurs between the magnetic shield layer 42 and the silicon substrate, increasing the possibility of cracking. Factors which relate to cracking may include: (a) size, thickness and shape of the silicon substrate; (b) size, thickness and shape of the magnetic shield layer 42; and (c) Ag paste heat treatment temperature.

In the embodiment, for relief of thermal stress due to the above difference in expansion coefficients, the flexible organic film 36 lies between the insulating film 34 for passivation and magnetic shield layer 42 which cover the silicon substrate.

In order to confirm the effect, different samples (magnetic sensor chips) on which different types of films are formed for the organic film 36 were prepared and experiments were conducted to investigate how cracking would occur. Specifically, for the organic film 36, three samples with different types of films as listed in Table 2, that is, a 0.5 μm thick polyimide film, a 1 μm thick polyimide film and a 0.7 μm thick resist film, were prepared. The chip was fixed to the Cu lead frame 50 through the Ag paste layer 52 by heat treatment (180° C., 60 min), followed by the step of cooling down to a room temperature and further down to −40° C. to measure the temperature at which cracking began to occur. The measurement results are shown in Table 2 as "Cracking temperature."

TABLE 2

| | Organic film | | |
|---|---|---|---|
| | Material | | |
| | Polyimide | Polyimide Thickness | Resist |
| | 0.5 μm | 1 μm | 0.7 μm |
| Cracking temperature | −40° C. or less | −40° C. or less | −40° C. or less |

Among the three samples, the two samples which use a polyimide film as the organic film 36 were produced by following the same steps as described above by reference to FIGS. 2 to 6. The sample which uses a resist film as the organic film 36 was produced by following the same steps as described above by reference to FIG. 2 and FIGS. 4 to 6 except the organic film formation step of FIG. 3A. In the case of this sample, the following step was taken for the organic film formation step of FIG. 3A: after rotary coating of a resist film on the upper face of the substrate, the resist film was pre-baked and subjected to exposure and development to form connecting holes 36a to 36c and then the resist film was baked at 250° C. to make it a film suitable for practical use.

Table 2 reveals that cracking occurred only at −40° C. or less in the samples using a polyimide film or a resist film as the organic film 36. In addition, in the subsequent step where these samples were heated to 250° C., cracking did not occur. Therefore, the magnetic sensor according to the present invention has an advantage that cracking does not occur in the temperature range from −40° C. to 250° C.

For comparison, Table 3 shows the results of cracking temperature measurements formed in the same manner as described above concerning a sample without a substitute film for the organic film 36 and samples with an Au substitute film for the organic film 36.

TABLE 3

| | Substitute film | | |
|---|---|---|---|
| | | Material | |
| | None | Au Thickness | Au |
| | | 2 µm | 4 µm |
| Cracking temperature | 25° C. or more | 0–25° C. | 0–25° C. |

In the case of the sample having no substitute film, the organic film 36 was not formed through the step of FIG. 3A and the magnetic shield layer 42 was formed on the insulating film 34 through the steps of FIG. 3B and FIG. 4A. This type of magnetic sensor chip is conventional. In the case of the samples having an Au film, a 2 or 4 µm thick Au film was formed instead of the organic film 36 which would be formed through the step of FIG. 3A and the magnetic shield layer 42 was formed on the Au film through the steps of FIG. 3B and FIG. 4A.

Table 3 shows that cracking is likely to occur in the sample having no substitute film and that even in the samples having a substitute Au film, cracking occurs in the temperature range from 0 to 25° C. This means that the presence of such Au film does not prevent cracking effectively.

Figure 19:
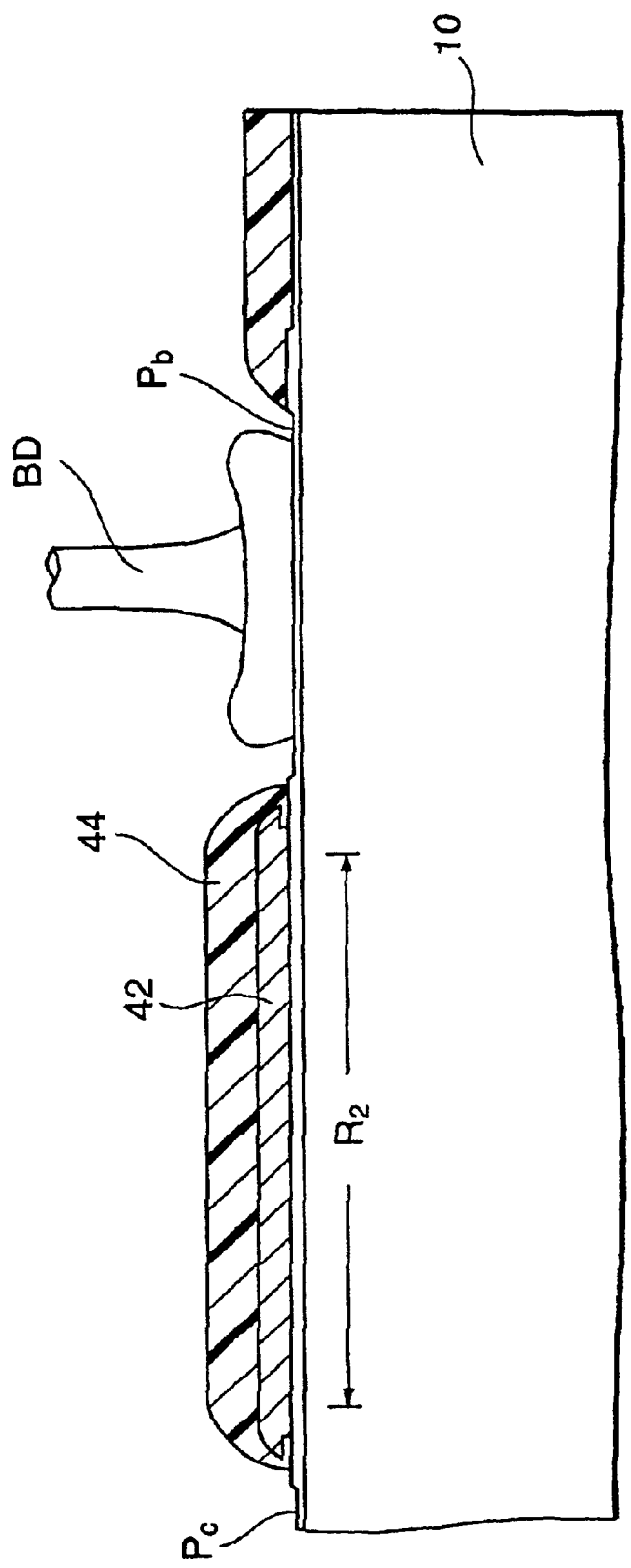
FIG. 19 is a sectional view showing a magnetic sensor chip connected with a bonding wire.

After the magnetic sensor chip is fixed to the Cu lead frame 50 through the Ag paste layer 52 as explained above, wires of Au or a similar material are bonded to the bonding pads Pa to Pc. FIG. 19 illustrates how a wire is bonded to a bonding pad (Pb in this example). Here, the same parts or components shown in FIG. 6 are marked with the same reference numerals and symbols. BD represents a bonding wire. The components (magnetoresistive device $R_2$, insulating film 34, organic film 36 and so on) lying under the magnetic shield layer 42 are much thinner than the magnetic shield layer 42 and the organic film 44, so they are not shown in this figure.

(Second Embodiment)

Figure 20:
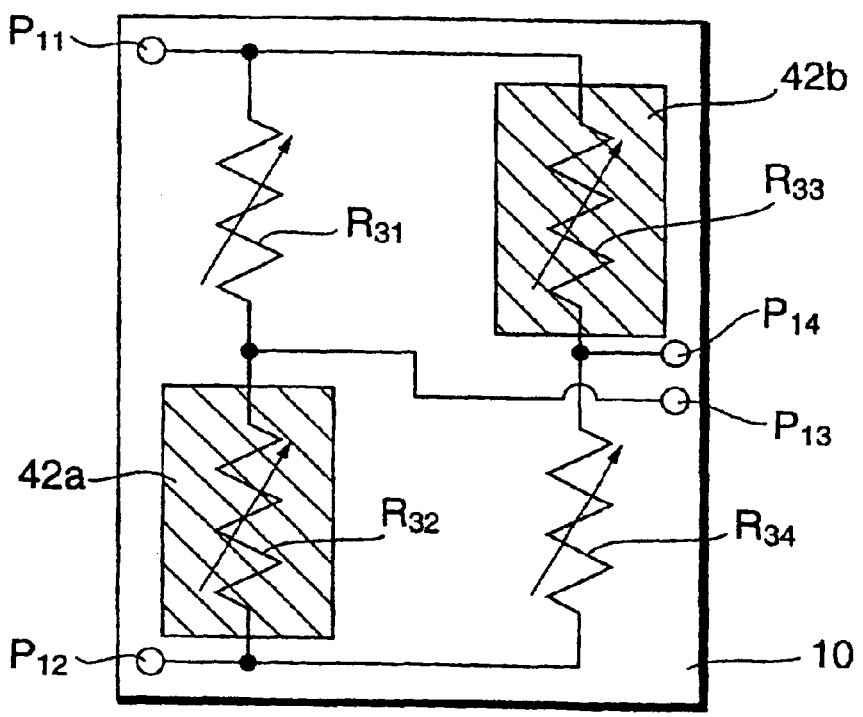
FIG. 20 is an equivalent circuit diagram showing a magnetic sensor according to a second embodiment of the present invention.

FIG. 20 shows a magnetic sensor according to the second embodiment of the present invention. On the insulating surface of the substrate 10, magnetoresistive devices $R_{31}$ and $R_{32}$ having the same structure as the magnetoresistive devices $R_1$ and $R_2$ (FIG. 1) are connected in series. Further, magnetoresistive devices $R_{33}$ and $R_{34}$ having the same structure as the magnetoresistive devices $R_1$ and $R_2$ are connected in series. $R_{32}$ and $R_{33}$ are covered through the insulating film 34 and the organic film 36 by the magnetic shield layers 42a and 42b, respectively, in the same manner as shown in FIG. 1A. Alternatively, the magnetic shield layers 42a and 42b may be not separated from each other but constitute a single continuous magnetic shield layer.

The serial path of magnetoresistive devices $R_{31}$ and $R_{32}$ and that of magnetoresistive devices $R_{33}$ and $R_{34}$ are connected in parallel. A bonding pad $P_{11}$ is connected at the section of interconnection of the devices $R_{31}$ and $R_{33}$, and a bonding pad $P_{12}$ is connected at the section of interconnection of the devices $R_{32}$ and $R_{34}$. Also, a bonding pad $P_{13}$ is connected at the section of interconnection of the devices $R_{31}$ and $R_{32}$, and a bonding pad $P_{14}$ is connected at the section of interconnection of the devices $R_{33}$ and $R_{34}$. In this way, the devices $R_{31}$ to $R_{34}$ constitute a resistance bridge circuit. When a given voltage is applied between the bonding pads $P_{11}$ and $P_{12}$, an output voltage which depends on the external magnetic field is generated between the bonding pads $P_{13}$ and $P_{14}$.

Like the magnetic sensor shown in FIG. 1A, the magnetic sensor shown in FIG. 20 also prevents cracking in the substrate 10 at the portions covered by the magnetic shield layers 42a and 42b, as described above.

A possible variation of the magnetic sensor shown in FIG. 20 is that two magnetic sensors of the same type as the one in FIG. 1A are connected in accordance with the same layout as shown in FIG. 20 to constitute a resistance bridge circuit. This variation will provide the same operation and advantage as the magnetic sensor shown in FIG. 20.

Figure 21:
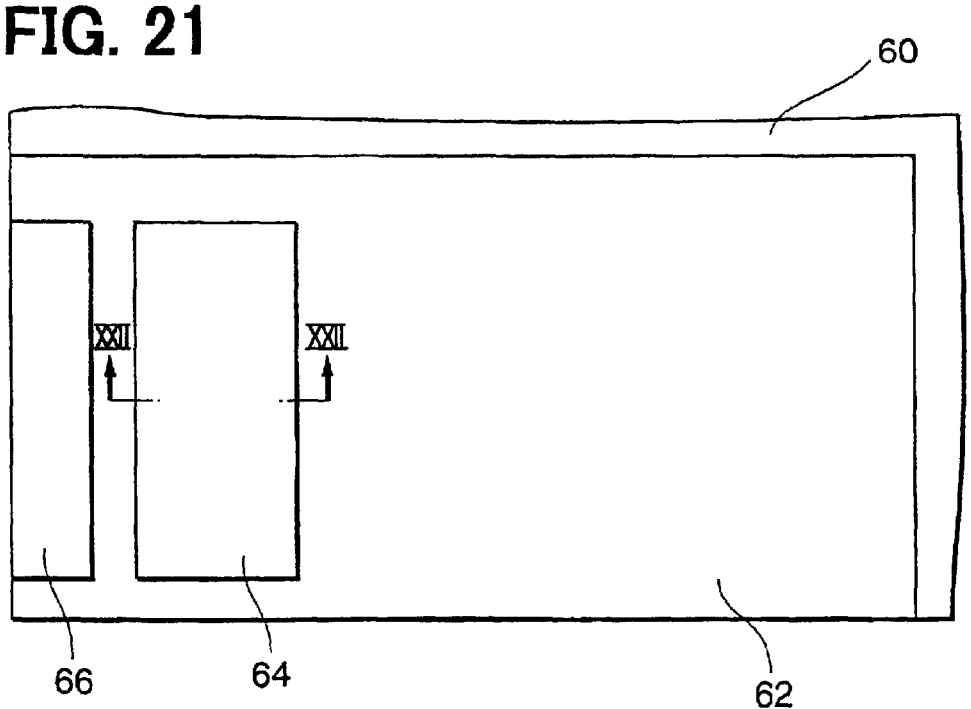
FIG. 21 is a top view showing an analytic model based on computer simulation.

FIG. 21 shows an analytic model used for computer simulation called FEM (Finite Element Method) analysis as viewed from above. Here, a silicon chip 62 which corresponds to the substrate (magnetic sensor chip) 10 is fixed on the surface of a lead frame 60, which corresponds to the Cu lead frame 50. Magnetic shield layers 64 and 66, which correspond to the magnetic shield layer 42 are fixed on the surface of the silicon chip 62 with a given interval between them. The magnetic shield layer 64 and magnetic shield layer 66 as fixed on the silicon chip 62 are identical in structure. Here, the structure of the magnetic shield layer 64 as fixed will be explained below, referring to the sectional view taken along the line XXII—XXII in FIG. 21.

Figure 22:
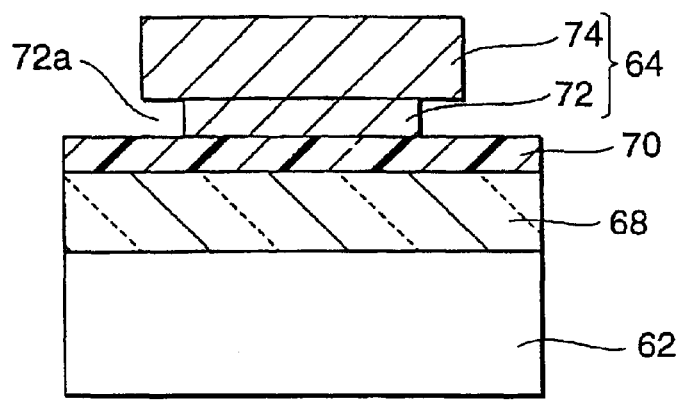
FIG. 22 is a sectional view taken along the line T–T' of FIG. 21 showing a thermal stress relief film in a fixed magnetic shield layer structure.

FIG. 22 is a sectional view taken along the line XXII—XXII in FIG. 21 in the case that a thermal stress relief film is used in the magnetic shield layer structure. A silicon oxide film 68 is formed on the surface of the silicon chip 62 and the magnetic shield layer 64 is fixed on the silicon oxide film 68 through the thermal stress relief film 70, which corresponds to the above organic film 36.

The magnetic shield layer 64 is a lamination constituted of a smaller rectangular magnetic shield layer (lower layer) 72 and a larger rectangular magnetic shield layer (upper layer) 74. The magnetic shield layers 72 and 74 are laid one upon the other in a way that an undercut 72a is formed at the bottom of each side wall of the magnetic shield layer 64 where the undercut has a square cross section in the direction of depth along the four sides of the magnetic shield layer 64 (right and left bottom portions shown in the figure). The magnetic shield layers 72 and 74 are both made of a Ni—Fe alloy with a Ni content of 45%, and have a thickness of 0.8 µm and a thickness of 9.2 µm, respectively.

Figure 23:
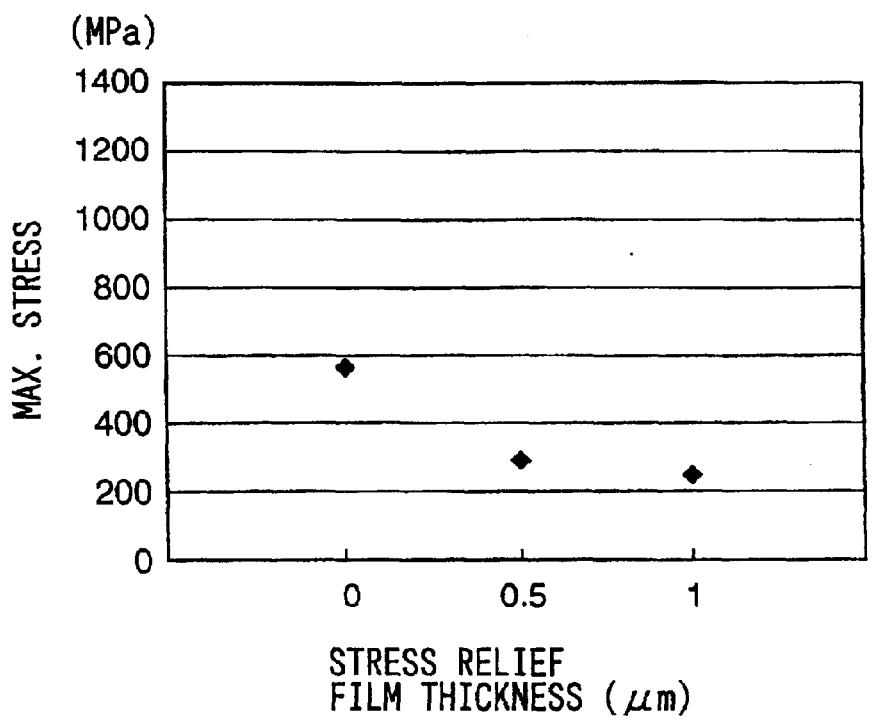
FIG. 23 is a graph showing the relation between the thickness of the thermal stress relief film and the maximum stress generated on the surface of the silicon chip surface.

FIG. 23 shows the result of analysis of the maximum stress generated on the silicon chip 62 with three different thicknesses of the thermal stress relief film 70 (0 µm, 0.5 µm, 1 µm). In this analysis, stress was generated on the surface of the silicon chip 62 by decreasing the temperature from 180° C. to –40° C. This temperature condition is the same as used for the stress analysis as described later. FIG. 23 shows that the maximum stress is smaller in the presence of a 0.5 µm or 1 µm thick thermal stress relief film 70 than in the absence of a thermal stress relief film 70 (i.e., 0 µm thickness).

Figure 24:
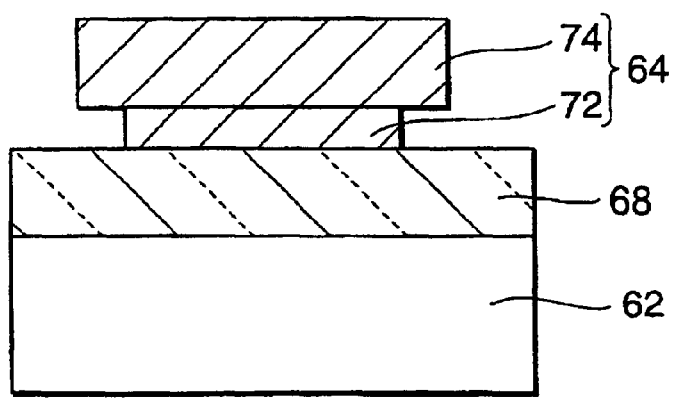
FIG. 24 is a sectional view taken along the line XXIV—XXIV in FIG. 21 showing a magnetic shield layer of Ni—Fe alloy in a magnetic shield layer structure.

FIG. 24 is a cross sectional view taken along the same line in FIG. 21 concerning the structure of the magnetic shield layer 64 where the above thermal stress relief film 70 does not exist but the magnetic shield layer 64 is made of a Ni—Fe alloy having a low Ni content. In FIG. 24, the same portions as those shown in FIGS. 21 and 22 are marked with the same reference numerals and their detailed descriptions are omitted here.

Figure 25:
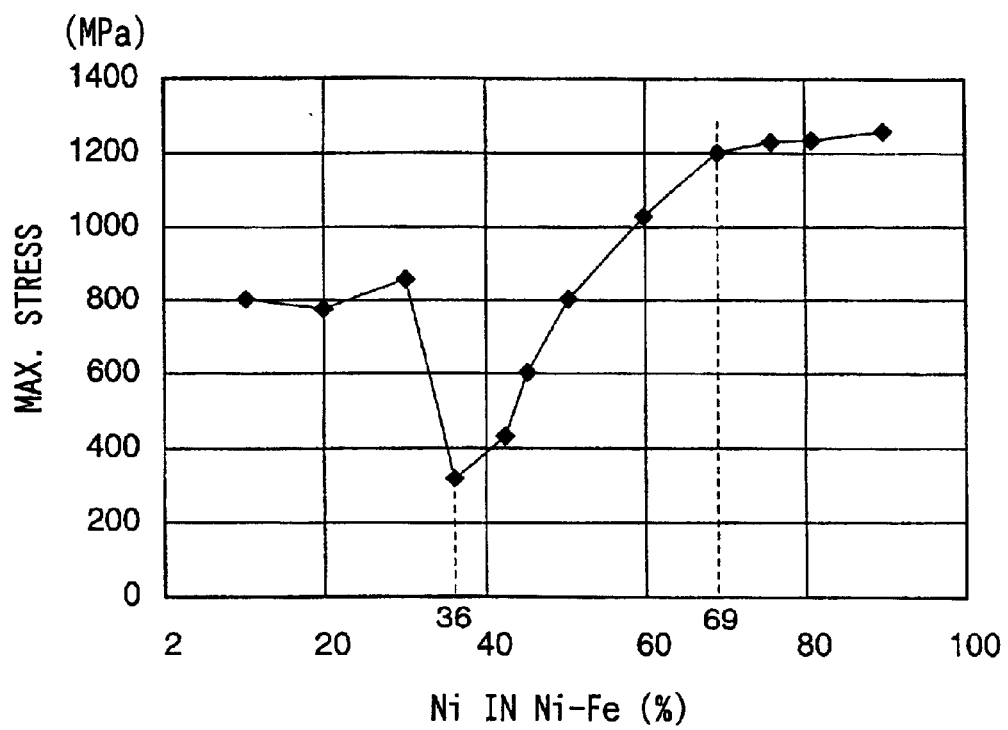
FIG. 25 is a graph showing the relation between the Ni content of Ni—Fe alloy and the maximum stress generated on the surface of the silicon chip surface.
Figure 26:
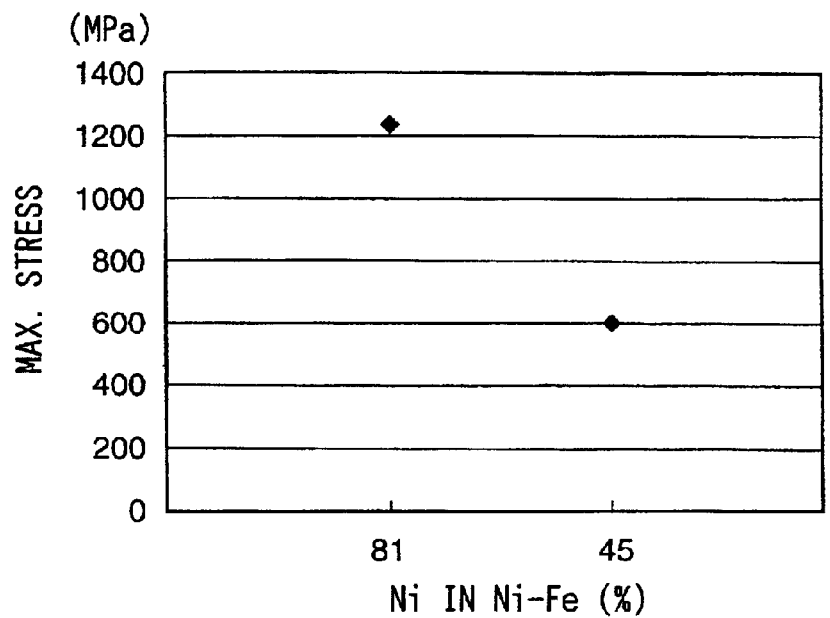
FIG. 26 is a graph showing the maximum stress generated on the surface of the silicon chip surface concerning a Ni—Fe alloy with a Ni content of 81% and one with a Ni content of 45%.

It is known that Ni—Fe alloys with different composition ratios have different expansion coefficients. FIGS. 25 and 26 show the results of analysis of maximum stress on the surface of the silicon chip 62 where the Ni content of the Ni—Fe alloy as the material for the magnetic shield layer 64 is changed. FIG. 25 shows that the stress on the silicon chip is the minimum with a Ni content of 36% and the stress is smaller with a Ni content of 69% or less (preferably from 32% to 50%) than with a Ni content of 70% or more.

Accordingly, in the magnetic shield layer structure as illustrated in FIG. 24, the Ni content of the magnetic shield layer 64 (72, 74) should be 69% or less (preferably from 32% to 50%). The use of such a magnetic shield layer 64 with a low Ni content will lead to reduction in stress due to its lower expansion coefficient, thus preventing cracking in the chip. In the magnetic shield layer structure illustrated in FIG. 22, it is desirable to use a Ni—Fe alloy with a Ni content of 69% or less (preferably from 32% to 50%) to form a magnetic shield layer 64 (72, 74). In addition to the stress reducing effect of the thermal stress relief film 70, the use of such a magnetic shield layer 64 reduces stress because its expansion coefficient is relatively low, so cracking in the chip can be prevented more effectively. In order to obtain a magnetic shield layer 64 of a Ni—Fe alloy with a low Ni content, the ratio of nickel sulfate to iron sulfate should be varied appropriately.

Figure 27:
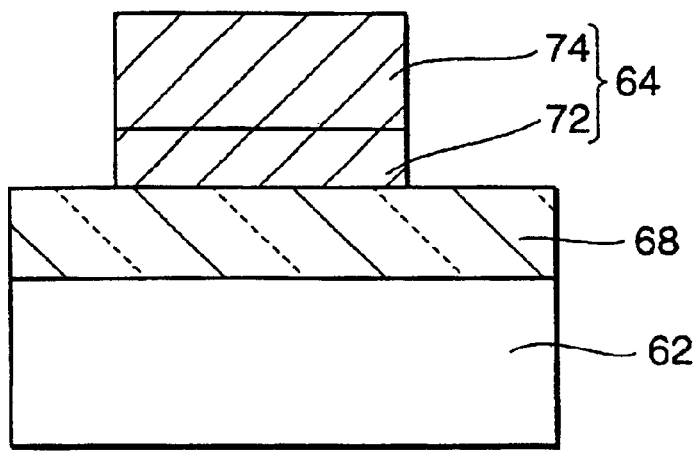
FIG. 27 is a sectional view taken along the line XXVII—XXVII in FIG. 21 showing a magnetic shield layer structure which has no undercut at the bottom of each side wall of the magnetic shield layer.
Figure 28:
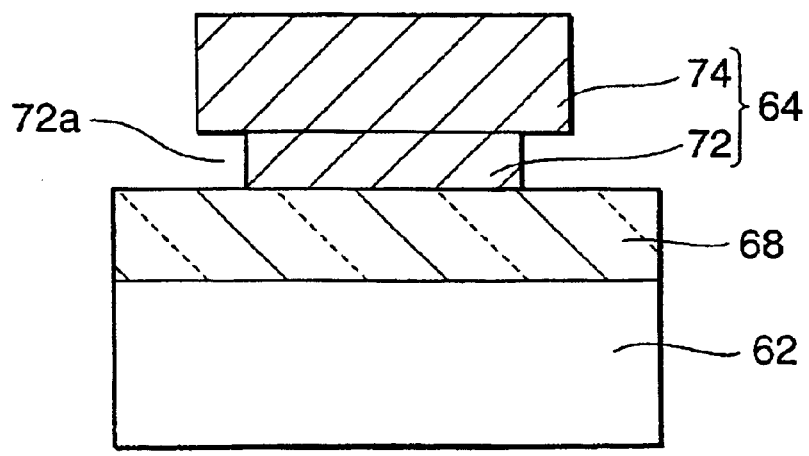
FIG. 28 is a sectional view taken along the line XXVIII—XXVIII in FIG. 21 showing a magnetic shield layer structure which has an undercut with a square cross section at the bottom of each side wall of the magnetic shield layer.
Figure 29:
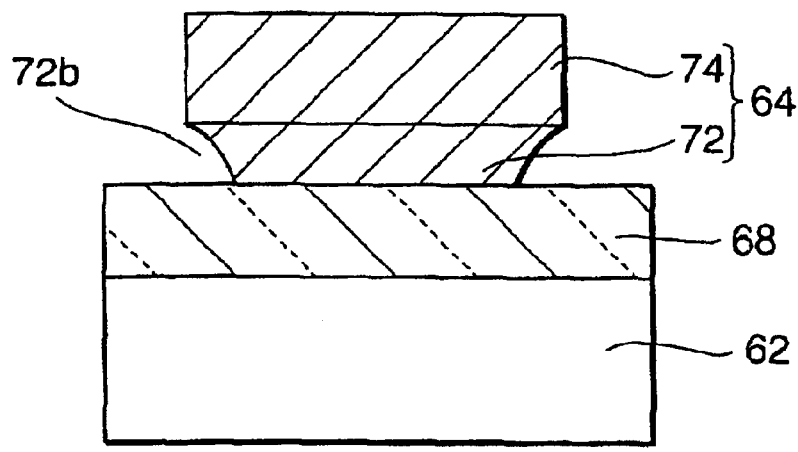
FIG. 29 is a sectional view taken along the line IXXX—IXXX in FIG. 21 showing a magnetic shield layer structure which has an undercut with a triangular cross section at the bottom of each side wall of the magnetic shield layer.

FIGS. 27 to 29 are sectional views taken along the same line in FIG. 21 where the profile of the bottom portion of each side wall of the magnetic shield layer is different. In FIGS. 27 to 29, the same portions as those shown in FIGS. 21 and 22 are marked with the same reference numerals and their detailed descriptions are omitted here.

In the structure illustrated in FIG. 27, there is no undercut at the bottom of each side wall of the magnetic shield layer 64. In other words, the magnetic shield layers 72 and 74 are rectangular and virtually identical in size and each side wall of the magnetic shield layer 64 is upright and straight from the bottom to the top. In the structure illustrated in FIG. 28, there is an undercut 72a with a square cross section along the bottom of each side wall of the magnetic shield layer 64 as stated above by reference to FIG. 22. In the structure illustrated in FIG. 29, there is an undercut 72b along the bottom of each side wall of the magnetic shield layer 64 which is the same as the undercut 72a shown in FIG. 28 except that the undercut 72b has a triangular cross section in the direction of depth (right and left bottom portions shown in FIG. 29).

Figure 30:
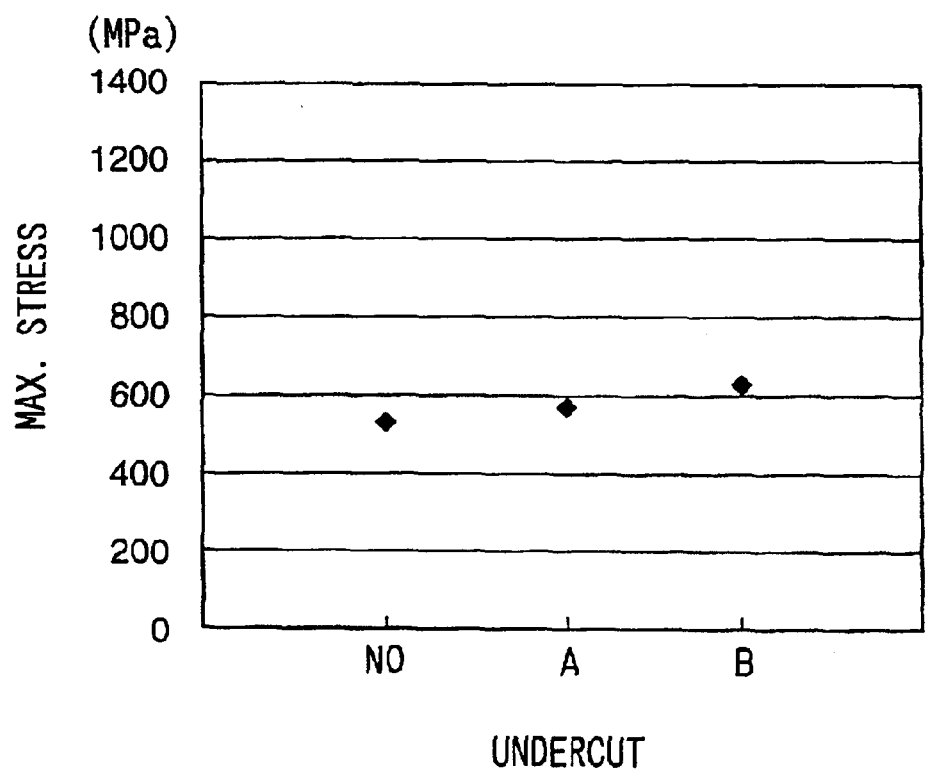
FIG. 30 is a graph showing the maximum stress generated on the surface of the silicon chip surface concerning the magnetic shield layer structures shown in FIGS. 27 to 29.

FIG. 30 shows the maximum stress generated on the surface of the silicon chip 62 concerning the magnetic shield layer structures shown in FIGS. 27 to 29. In the graph of FIG. 30, "No undercut," "Undercut A" and "Undercut B" correspond to the structures shown in FIGS. 27, 28 and 29, respectively. FIG. 30 shows that the structure with no undercut (FIG. 27) generates less stress than the structures shown in FIGS. 28 and 29.

Therefore, when the magnetic shield layer structures as described above by reference to FIGS. 22 and 24 have no undercut as shown in FIG. 27, cracking in the chip can be prevented more effectively. In order to obtain a structure with no undercut as shown in FIG. 27, in the coating step as described above by reference to FIG. 4A, the thickness of the resist layer 40 should be increased to prevent the upper portion of the magnetic shield layer 42 from protruding horizontally.

The above embodiments may be implemented in other specific forms. For instance, a high permeability alloy other than Ni—Fe alloy may be used as the material for the magnetic shield layer and an alloy with a smaller expansion coefficient may be used.

As discussed so far, according to the present invention, an organic film for relieving thermal stress is formed under the magnetic shield layer and/or a Ni—Fe alloy having a Ni content of 69% or less is used as the material for the magnetic shield layer in order to prevent cracking in the magnetic sensor chip which has been bonded. As a result, the yield rate in the manufacture of magnetic sensors is improved.

What is claimed is:

1. A magnetic sensor comprising:

a substrate which has at least one insulating main surface;

at least two serially connected magnetoresistive devices, formed on the insulating main surface, each of which includes at least one magnetic tunnel junction device;

an organic film, which is for relieving thermal stress and formed to cover one of the magnetoresistive devices through an insulating film for passivation; and a magnetic shield layer, which is formed to cover the one of the magnetoresistive devices covered by the organic film through the organic film and the insulating film.

2. The magnetic sensor according to claim 1, further comprising:

another organic film formed on the organic film to cover the magnetic shield layer.

3. The magnetic sensor according to claim 1, further comprising a wiring layer provided between the magnetoresistive devices and the insulating film.

4. The magnetic sensor according to claim 1, wherein the substrate is made of silicon.

5. The magnetic sensor according to claim 1, wherein the substrate includes another surface fixed to a lead frame through an Ag paste layer.

6. The magnetic sensor according to claim 1, wherein the magnetic shield layer is made of a nickel-iron alloy having a nickel content of 69% or less.

7. The magnetic sensor according to claim 1, wherein the organic film is about 0.5–1.0 µm in thickness.

8. A magnetic sensor comprising:

a substrate which has at least one insulating main surface made of silicon;

at least two serially connected magnetoresistive devices, formed on the insulating main surface, each of which includes at least one magnetic tunnel junction device; and a magnetic shield layer, which is formed to cover one of the two magnetoresistive devices through an insulating film for passivation and made of a nickel-iron alloy having a nickel content of 69% or less.

9. The magnetic sensor according to claim 8, wherein the magnetic shield layer is formed on the insulating film through an organic film for relieving thermal stress.

10. The magnetic sensor according to any one of claims 1 to 9, wherein the magnetic shield layer has no undercut along the bottom of each of its side walls.

11. The magnetic sensor according to claim 8, further comprising a bonding pad located on the substrate between the at least two serially connected magnetoresistive devices.

12. The magnetic sensor according to claim 8, wherein another surface of the substrate is fixed to a lead frame through an Ag paste layer.

13. The magnetic sensor according to claim 9, wherein the organic film is about 0.5–1.0 µm in thickness.

14. A magnetic sensor comprising:

a substrate including an insulating layer formed thereon;

at least two magnetoresistive devices formed on the substrate and connected through the insulating layer by a wiring layer;

an organic film formed on the insulating layer for relieving thermal stress; and a magnetic shield layer formed on top of at least one of the magnetoresistive devices.

* * * * *